United States Patent
Kärkkäinen et al.

(10) Patent No.: US 11,127,864 B2
(45) Date of Patent: Sep. 21, 2021

(54) CARBOSILOXANE POLYMER COMPOSITIONS, METHODS OF PRODUCING THE SAME AND THE USE THEREOF

(71) Applicant: Optitune Oy, Oulu (FI)

(72) Inventors: Ari Kärkkäinen, Oulu (FI); Milja Hannu-Kuure, Oulu (FI); Admir Hadzic, Oulu (FI); Jarkko Leivo, Oulu (FI); Henna Järvitalo, Oulu (FI); Rauna-Leena Kuvaja, Oulu (FI)

(73) Assignee: Optitune Oy, Oulu (FI)

( * ) Notice: Subject to any disclaimer, the term of this patent is extended or adjusted under 35 U.S.C. 154(b) by 157 days.

(21) Appl. No.: 15/559,074

(22) PCT Filed: Mar. 17, 2016

(86) PCT No.: PCT/FI2016/050167
§ 371 (c)(1),
(2) Date: Sep. 18, 2017

(87) PCT Pub. No.: WO2016/146897
PCT Pub. Date: Sep. 22, 2016

(65) Prior Publication Data
US 2018/0277691 A1    Sep. 27, 2018

Related U.S. Application Data

(60) Provisional application No. 62/134,031, filed on Mar. 17, 2015.

(30) Foreign Application Priority Data

Mar. 17, 2015   (FI) .................................... 20155184

(51) Int. Cl.
| | | |
|---|---|---|
| *H01L 31/02* | (2006.01) | |
| *C09D 5/00* | (2006.01) | |
| *C09D 183/04* | (2006.01) | |
| *C09D 183/08* | (2006.01) | |
| *G02B 1/111* | (2015.01) | |
| *H01L 31/048* | (2014.01) | |
| *H01L 31/068* | (2012.01) | |
| *H01L 31/18* | (2006.01) | |
| *H01L 51/00* | (2006.01) | |
| *H01L 51/44* | (2006.01) | |
| *H01L 31/0216* | (2014.01) | |

(Continued)

(52) U.S. Cl.
CPC ........ *H01L 31/02168* (2013.01); *C09D 5/006* (2013.01); *C09D 183/04* (2013.01); *C09D 183/08* (2013.01); *G02B 1/111* (2013.01); *H01L 31/02366* (2013.01); *H01L 31/022475* (2013.01); *H01L 31/0488* (2013.01); *H01L 31/068* (2013.01); *H01L 31/186* (2013.01); *H01L 51/0094* (2013.01); *H01L 51/442* (2013.01); *H01L 51/447* (2013.01); *H01L 31/0296* (2013.01); *H01L 31/02167* (2013.01); *H01L 31/0322* (2013.01); *H01L 31/035218* (2013.01); *H01L 51/004* (2013.01); *H01L 51/0043* (2013.01); *H01L 51/5206* (2013.01); *H01L 51/5221* (2013.01); *H01L 51/5281* (2013.01); *H01L 51/56* (2013.01); *H01L 2251/308* (2013.01); *Y02E 10/547* (2013.01)

(58) Field of Classification Search
CPC ....... H01L 31/02168; H01L 31/022475; H01L 31/02366; H01L 31/0488; H01L 31/068; H01L 31/186; H01L 51/0094; H01L 51/442; H01L 51/447; H01L 31/02167; H01L 31/0296; H01L 31/0322; H01L 31/035218; H01L 51/004; H01L 51/0043; H01L 51/5206; H01L 51/5221; H01L 51/5281; H01L 51/56; H01L 2251/308; C09D 5/006; C09D 183/04; C09D 183/08; G02B 1/111; Y02E 10/547
USPC ......................................................... 136/256
See application file for complete search history.

(56) References Cited

U.S. PATENT DOCUMENTS

| | | | | |
|---|---|---|---|---|
| 2012/0040179 A1* | 2/2012 | Dave | ...................... | C08G 77/24 428/336 |
| 2013/0152995 A1 | 6/2013 | Kuromiya et al. | | |
| 2015/0037570 A1 | 2/2015 | Brophy et al. | | |

FOREIGN PATENT DOCUMENTS

| | | |
|---|---|---|
| CN | 103013189 A | 4/2013 |
| GB | 2510211 A | 7/2014 |

(Continued)

OTHER PUBLICATIONS

Sanchez et al: Applications of advanced hybrid organicinorganic nanomaterials: from laboratory to market. Chemical Society Reviews Jan. 1, 2011, vol. 40, No. 2, pp. 696-753.

*Primary Examiner* — Ling Siu Choi
*Assistant Examiner* — Ronald Grinsted
(74) *Attorney, Agent, or Firm* — Laine IP Oy

(57) ABSTRACT

A method of producing a photovoltaic cell having a cover, comprising the steps of: providing a photovoltaic cell which comprises a crystalline silicon substrate; providing a transparent substrate; forming an antireflective coating on said transparent substrate to provide a coated transparent substrate; and covering the photovoltaic cell with said coated transparent substrate. The antireflective coating is a hybrid organic-inorganic material having an inorganic portion comprising silicon, oxygen and carbon, and further comprising an organic portion with organic groups connected to the inorganic portion. Methods of producing solar panels, coated glass substrates as well as antireflection coatings are disclosed as well as novel compositions of hybrid organic-inorganic materials.

12 Claims, 4 Drawing Sheets

(51) Int. Cl.
  *H01L 31/0224* (2006.01)
  *H01L 31/0236* (2006.01)
  *H01L 31/0296* (2006.01)
  *H01L 31/032* (2006.01)
  *H01L 31/0352* (2006.01)
  *H01L 51/52* (2006.01)
  *H01L 51/56* (2006.01)

(56) References Cited

FOREIGN PATENT DOCUMENTS

| | | |
|---|---|---|
| JP | 2007025077 A | 2/2007 |
| KR | 20110084623 A | 7/2011 |
| KR | 20140100879 A | 8/2014 |
| WO | WO2013174754 A2 | 11/2013 |
| WO | WO2014035468 A1 | 3/2014 |
| WO | WO2016146897 A2 | 9/2016 |

* cited by examiner

CARBOSILOXANE POLYMER COMPOSITIONS, METHODS OF PRODUCING THE SAME AND THE USE THEREOF

TECHNICAL FIELD

The present invention relates to solution processible siloxane polymers, in particular hybrid carbosiloxane polymer materials. The present invention also concerns the use of such polymer materials in optoelectronics device structures, such as display devices, touch screen devices, and photovoltaic devices and apparatuses. The present invention further relates to methods of applying the materials in various optoelectonic device fabrication processes and to synthesis and polymerization methods of such material compositions.

BACKGROUND ART

Display devices, touch screen devices, photovoltaic devices, luminaires and construction glass units are typically manufactured and constructed using single or multiple substrates (glass, silicon, plastic and metal) and a number of thin-film materials. The substrate and the material properties and respective interfaces, inside and outside of the device, affect greatly the overall performance of the device.

There is a constant demand for increasing the performance of such devices in terms of efficiency, visual quality and form factor and durability. Optimization can be done at the interfaces to minimize unwanted reflections and/or maximize transmission. Two examples are in-coupling of maximum amount of light into the device (solar module) or maximizing the out-coupling of light from the device (display or luminaire device). A further important aspect in display devices is minimizing the reflections from the device towards the viewer.

Anti-reflection coatings can be applied at substrate interfaces to achieve in- and out-coupling of light. The index of refraction and thickness of the coating(s) are selected such that reflection is minimized and transmission maximized at the specific interface. A typical way of making anti-reflective coatings is by a vacuum process either by sputtering or by chemical vapour deposition. These are in general high cost batch processes and not acceptable in many cases especially with larger substrate sizes.

There are also a number of liquid phase coatings, which can provide good antireflection properties but which are deficient in term of hardness, adhesion, scratch resistance and anti-soiling and cleanability properties.

In many applications, such as solar modules, display devices and construction glasses, there is a need for high performance coatings wherein desired properties are combined into a single layer with high durability of the coating properties.

Another need relates to the provision of materials which form coatings which exhibit a plurality of properties, such as high scratch resistance, high environmental durability and stability, in combination with good antireflection properties.

SUMMARY OF INVENTION

Technical Problem

Based on the above, it is an aim of the present invention to provide material compositions which will provide coating layers for substrate surfaces, which have good anti-reflectivity properties combined with at least two of the following properties: high hardness, adhesion, scratch resistance, antisoiling and cleanability properties.

It is also an aim to provide material composition which will provide chemically and mechanically and environmentally highly stabile coating layers.

It is another aim of the present invention to produce silicone-based polymer compositions which are suitable for use in optoelectric devices as antireflective layers, as well as novel kinds of solar modules and cells having carbosilane polymer coatings.

It is a further aim of the present invention to provide a method of making antireflective glass.

It is still a further aim of the present invention to improve the efficiency of photovoltaic modules and cells.

It is still a further aim of the present invention to improve the efficiency of a luminaire, light source and display constructed by using organic light emitting diode (OLED), light emitting diode (LED) or traditional illumination/light emission sources.

It is still a further aim to provide a material which reaches predetermined properties of antireflection and cleanability at low temperatures, in particular at temperatures of about 250 to 500° C., as well as at high temperatures, in particular at temperatures of about 550 to 800° C.

Solution to Problem

The present invention is based on the idea of providing on a transparent substrate an antireflective coating which is a hybrid organic-inorganic material having an inorganic portion comprising silicon, oxygen and carbon, and further comprising an organic portion with organic groups connected to the inorganic portion.

Suitable materials of the present kind can be produced by hydrolysing silane monomer(s); condensation polymerizing the hydrolysed silane monomer(s) to form a carbosiloxane prepolymer; and mixing the carbosiloxane polymer with at least one solvent capable of dissolving said polymer and, optionally with at least one additive, in order to formulate a carbosiloxane prepolymer liquid composition.

Monomers for use in the present invention include, for example, monomers of formulas I, II and III:

$$R^1_a SiX_{4-a} \quad\quad\quad I$$

and $$R^2_b SiX_{4-b} \quad\quad\quad II$$

wherein $R^1$ and $R^2$ are independently selected from the group consisting of hydrogen, linear and branched alkyl and cycloalkyl, alkenyl, alkynyl, (alk)acrylate, epoxy, allyl, vinyl and alkoxy and aryl having 1 to 6 rings; each X represents independently a hydrolysable group or a hydrocarbon residue; and a and b is an integer 1 to 3;

$$R^3_c SiX_{4-c} \quad\quad\quad III$$

wherein $R^3$ stands for hydrogen, alkyl or cycloalkyl which optionally carries one or several substituents, or alkoxy;
each X represents independently a hydrolysable group or a hydrocarbon residue having the same meaning as above; and
c is an integer 1 to 3.
and combinations thereof
together with monomers of formula VI:

$$R^6{}_3Si-Y-Si_3 \quad\quad\quad VI$$

wherein $R^6$ and $R^7$ are independently selected from hydrogen and a group consisting of linear or branched alkyl, cycloalkyl, alkenyl, alkynyl, (alk)acrylate, epoxy, allyl, vinyl, alkoxy and aryl having 1 to 6 rings, and wherein the group is substituted or unsubstituted; and Y is a linking group selected from unsubstituted and substituted bivalent aliphatic and aromatic groups, such as alkylene, arylene, —O-alkylene-O—; —O-arylene-O—; alkylene-O-alkylene, arylene-O-arylene; alkylene-$Z^1$C(=O)$Z^2$-alkylene, arylene-$Z^1$C(=O)$Z^2$-arylene and —O-alkylene-$Z^1$(=O)$Z^2$-alkylene-O—; —O-arylene-$Z^1$(=O)$Z^2$-arylene-O—, wherein $Z^1$ and $Z^2$ are each selected from a direct bond or The monomers are homo- or copolymerized to yield corresponding siloxane polymers.

Optionally the monomers are homo- or copolymerized to yield corresponding siloxane polymers or prepolymers, which can be further cured to yield high-molecular weight coatings.

The siloxane polymer thus obtained can be deposited on a glass or other substrate (glass, plastic or polymer) by liquid phase coating so as to form an antireflective layer on the substrate. The substrate can have the antireflective coating on one side only or it can have the antireflective layer on both sides of the substrate. It is also possible to use two (or more) individual coating layers on top of each other on either one side of the substrate or on both sides of the substrate (or combinations thereof). The coated substrate can then be used as a cover substrate or as one of the inner substrates in a device assembly (such as a display device, a touch screen device, a photovoltaic device, luminaires and construction glass units).

The antireflective layer is typically formed by a film having a thickness in the range of, generally, 5 nm-10 µm, such as 20 nm to 2 µm, for example 80 nm to 1 µm.

Based on the above, the present materials can be used in methods of producing photovoltaic modules and cells which have a coating cover. The method typically comprises the steps of:

providing a photovoltaic cell which comprises a crystalline silicon substrate;
providing a transparent substrate;
forming an antireflective coating from the instant carbosiloxane polymer composition on the substrate; and
using the coated substrate for covering the photovoltaic cell.

Novel solar panels of the present kind comprise not only crystalline silicon substrates but also transparent substrates laminated with the crystalline silicon substrate, and they have an antireflective coating which comprises silicon, oxygen and carbon.

The present invention finally provides a method of using the hybrid carbosiloxane prepolymer composition in the formation of anti-reflection, high hardness, adhesion, scratch resistance and anti-soiling and easily cleanable coating, comprising depositing the composition on a substrate to form a layer having a film thickness of 5 nm-10 µm.

Advantageous Effects of Invention

Considerable advantages are obtained by the present invention.

Films and other coatings can be produced from the present compositions. Mechanical durability and long-term stability of the anti-reflectivity properties combined with high hardness, adhesion, scratch resistance and anti-soiling and cleanability properties are achieved and sustained due to chemically and physically homogeneous nature of the coating.

The novel coatings can be used in optoelectronics devices to give improved properties of transmission and reflection to enhance functionality and performance of the devices.

Thus, it can be mentioned by way of an example that a glass substrate provided with the present anti-reflective coatings will transmit considerably much more (in one embodiment at least 1.5% or preferably at least 2%) light at 400 nm to 800 nm than the same glass of the same thickness without the same coating layer.

Embodiments of the present technology provide material compositions that are suitable for producing films (and structures) by using conventional and cost-efficient atmospheric deposition processing from the liquid phase.

The present compositions are suitable for producing films and structures by using conventional and cost-efficient atmospheric deposition processing from the liquid phase, including spin-on, dip, spray, ink-jet, roll-to-roll, gravure, flexographic, curtain, drip, roller, screen printing coating methods, extrusion coating and slit coating.

In the following, embodiments will be described with reference to the attached drawings.

DESCRIPTION OF EMBODIMENTS

Figure 1:
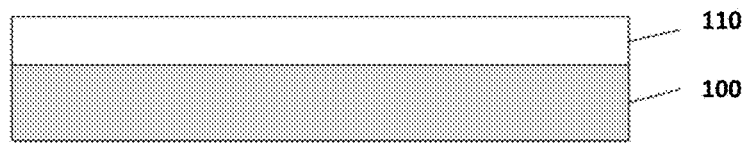
FIG. 1 shows the cross-section of a substrate 100 and material film 110.

As briefly discussed above, the present invention generally achieves novel hybrid carbosiloxane polymer compositions for producing anti-reflective coatings with a combination of properties selected from high hardness, adhesion, scratch resistance, anti-soiling and cleanability.

A "photovoltaic cell" is an electrical device that converts the energy of light directly into electricity by the photovoltaic effect. Typically, a silicon substrate, such as a silicon wafer (or other functional active layers creating the p-n junction), is part of a photovoltaic cell. A photovoltaic cell is, again, part of a photovoltaic panel or module.

In the present invention, "alkyl" typically stands for linear or branched alkyl group(s) having 1 to 10, preferably 1 to 8, for example 1 to 6 carbon atoms, such as 1 to 4 carbon atoms, and optionally exhibiting typically 1 to 5 substitutents. Such substituents can be selected, for example, from the group of halogen, hydroxyl, vinyl, epoxy and allyl.

In "alkoxy" and in the bivalent "alkylene" groups and other similar aliphatic groups, the alkyl residue (or residue derived from an alkyl moiety) has the same meaning as above, i.e. stands for the same number of carbon atoms (1 to 10, preferably 1 to 8, or 1 to 6 or even 1 to 4), and contains substituents as explained in the foregoing. Examples of unsubstituted alkylene groups include ethylene and methylene and propylene.

"Arylene" stands for an aromatic bivalent group containing typically 1 to 3 aromatic rings, and 6 to 18 carbon atoms. Such groups are exemplified by phenylene (e.g. 1,4-phenylene and 1,3-phenylene) and biphenylene groups as well as naphthylene or anthracenylene groups.

The alkylene and arylene groups can optionally be substituted with, for example, 1 to 5 substituents selected from hydroxy, halo, vinyl, epoxy and allyl groups as well as alkyl, aryl and aralkyl groups.

Preferred alkoxy groups contain 1 to 4 carbon atoms. Examples are methoxy and ethoxy.

The term "phenyl" includes substituted phenyls such as phenyltrialkoxy, in particular phenyltrimethoxy or triethoxy, and perfluorophenyl. The phenyl as well as other aromatic or alicyclic groups can be coupled directly to a silicon atom or they can be coupled to a silicon atom via a methylene or ethylene bridge.

The novel polymer materials will be discussed below in greater detail. However, generally it can be noted that suitable materials for antireflective coatings are obtained by polymerizing a plurality of silicon containing monomers. Typically, at least one of the monomers contains silicon and oxygen, and another of the monomers contains silicon and carbon. There are at least some organic groups selected from lower alkyl groups, such as methyl groups, in the monomers.

In one embodiment, new material compositions are provided which have suitable properties to be used as single layer coatings for achieving the desired combinations of properties on glass surfaces.

In another embodiment, material compositions are provided that can be cured at relatively low processing temperatures e.g. at a temperature of max 350° C. or even at a temperature of about 70 to 100° C., which makes it possible for the material films or structures to be cured at a low temperature, such as chemically tempered glass and plastics/polymers.

Alternatively, in a further embodiment, material compositions are provided that can be cured at temperatures up to 350° C., or even up to 800° C., which makes it possible for the material films or structures to be cured at a high temperature curing, such as tempering of the glass.

In particularly interesting embodiments, material compositions are achieved which produce optically good quality coatings on curved glass or plastics or bendable/flexible surfaces, whereas the coating has the mechanical properties to allow such bending/flexing.

In other embodiments, material compositions are further achieved that can be cured to form optically clear AR coatings with high transmission perpendicularly to the substrate surface but also very high transmission in oblique angles relative to the substrate surface.

The deposited material can be cured to form optically extremely clear and uniform AR coating with optimized transmission properties for crystalline silicon cell based solar module cover glass to result in maximized output power improvement by properly matching the coating transmission with the silicon cell absorption properties.

Material compositions of further embodiments can be cured to form optically extremely clear and uniform AR coating with optimized transmission properties for thin-film based solar module (by thin-film meaning: cadmium telluride, copper indium gallium selenide, amorphous silicon, microcrystalline silicon and other thin-film silicon, dye-sensitized and organic solar cells or the like) cover glass to results in maximized output power improvement by properly matching the coating transmission with the thin-film cell absorption properties.

Still further embodiment comprises material compositions that can be deposited to yield coating layers which, after curing, exhibit a transmission increase relative to the non-AR coated glass of 1.5-4.0%, preferably over 2.5%. Other embodiments give material compositions that will yield coating layers which, after curing, give a solar module output power increase relative to the non-AR coated module of 2.0-6.0%, preferably over 3.0% when using single layer coating on the rear side of the cover glass.

Coating layers can also be produced which, after curing, give a solar module output power increase relative to the non-AR coated module of 5.0-12%, preferably over 6.0% when using a first antireflection coating on the first surface of the cover substrate and a second antireflective coating on the second surface of the cover substrate, which is opposite to the first substrate surface. The first antireflection coating can either be similar or identical to the second antireflection coating or can be selected individually to have different properties.

Coating layers can also be produced which, after curing, give an organic light emitting diode (OLED) illumination output increase relative to the non-AR coated OLED of 10 to 30%, preferably over 15% when using first antireflection coating on the first surface of the OLED substrate and a second antireflective coating on the second surface of the OLED substrate, which is opposite to the first substrate surface. The first antireflection coating can either be similar or identical to the second antireflection coating or can be selected individually to have different properties.

The polymer compositions are preferably thermally curable and/or optionally irradiation curable materials. The patterning of the films can be performed via direct lithographic patterning, conventional lithographic masking and etching procedure, imprinting and embossing, ink-jet printing, 3D/4D printing, but are not limited to these.

Thermal curing can be done in a conventional oven, IR oven, tempering furnace, or by blow dry or similar. The curing may involve pre-curing stage where the carrier solvent (in-case when used) is removed at least partially by an additional heat curing or vacuum or blow dry step.

The present embodiments do not discriminate between different glass types. These include thick glass and thin glass and also non-tempered, chemically tempered and thermally tempered glass. Generally, the thickness of the glass is usually 5 mm or less, in particular 4 mm or less, typically 3.2 mm or less, in some embodiment 3 mm or less, and for example 2 mm or less, or in some embodiment even 0.8 mm and 0.5 mm or less.

In case of chemically tempered glass it is necessary to have a coating composition which can be cured at temperature of 350° C. or preferable at temperature below 250° C. The same low temperature requirement applies in case of the thermally tempered glass, when the coating is applied after the tempering of the glass.

For some applications, material composition are provided that result in coating layer which, after curing, exhibit a refractive index of 1.5 to 1.2 and preferably 1.45 to 1.25 at 632 nm. Other embodiments of material compositions result in coating layers, which after curing, exhibit a refractive index of 2.2 to 1.5 and preferably 1.6 to 1.8 at 632 nm.

In a still further embodiment, material compositions are achieved capable of forming a smooth and uniform AR coating surface to prevent dirt accumulation. The average surface roughness (Ra) of the AR coating should be between 0.5 nm to 5.0 nm and preferably below 2.5 nm.

Embodiments also comprise applications that give rise to a smooth and uniform coating surface after curing with a water contact angle of over 90° C., preferably in excess of 100°, which further prevent dirt accumulation together with the effect from the surface morphology resulting in a combined effect.

As regards hardness of the coatings, including all of the above disclosed various embodiments; the present technology generally provides coating layers which, after curing, exhibit a pencil hardness of 3H-9H, more preferably over 4H.

The above parametres are determined by standardized methods as explained below in connection with the examples. Thus, for example, the oil contact angle can be measured by placing a drop of n-hexadecane on the surface of the cover and measuring the contact angle thereof.

In one embodiment, siloxane prepolymer has a molecular weight of from 60,000 to 120,000 g/mol.

In one embodiment, the siloxane prepolymer has a molecular weight of from 2,000 to 10,000 g/mol.

In one embodiment, the siloxane prepolymer, formed by a blend or mixture of several prepolymers, has a molecular weight of from 20,000 to 60,000 g/mol.

In one embodiment, the siloxane polymer deposited on the substrate has after curing a molecular weight of 30,000 g/mol to 10,000,000 g/mol, in particular about 50,000 to 5,000,000 g/mol, 100,000 g/mol to 1,000,000 g/mol.

In one embodiment, which can be combined with any of the above embodiments, the coating layer has a thickness of about 80 nm to 1 μm, in particular about 90 nm to 600 nm.

In general, the present material compositions provide coating layer which are essentially amorphous.

Based on the afore-going, a method of using the hybrid carbosiloxane prepolymer composition in the formation of coatings exhibiting at least one, preferably two, property selected from the group of anti-reflection, high hardness, adhesion, scratch resistance, anti-soiling and easy clean coating, typically comprises the steps of

- optionally adjusting the solid content of the liquid composition of the hybrid carbosiloxane prepolymer composition material to result in a required film thickness of the deposited film and selecting the proper solvent for a specific coating method;
- optionally adding photoactive or thermally active additives or catalysts to the composition;
- depositing the composition on a substrate to form a layer having a film thicknesses of 5 nm-10 pin,
- optionally heat treating the deposited film,
- optionally subjecting the deposited material layer to UV exposure, and
- optionally heat treating the deposited and/or exposed film The thickness of the hybrid material can be, for example, 50 to 1000 nm, on some cases preferably 300 nm 600 nm, in particular 90 to 125 nm.

In one embodiment, forming of the antireflective coating on the substrate, comprises depositing a carbosiloxane polymer on the substrate by liquid phase coating and baking at 200° C. or less.

In another embodiment, forming of the antireflective coating on the substrate, comprises depositing a carbosiloxane polymer on the substrate by liquid phase coating and baking at from 500 to 800° C., preferably at 600 to 700° C.

In a third embodiment, forming of the antireflective coating on the substrate, comprises depositing a carbosiloxane polymer on the substrate by liquid phase coating and baking at from 200 to 550° C., preferably at 250 to 350° C.

In a specific embodiment, the coating may comprise fluorine, the atom % of any fluorine being up to 10, whereas the atom % of silicon is from 20 to 30, wherein the atom % of carbon is from 10 to 70, and the atom % of oxygen is from 5 to 60.

In an alternative embodiment, the coating comprises fluorine, the atom % of fluorine being from 4 to 7, wherein the atom % of silicon is from 20 to 30, wherein the atom % of carbon is from 20 to 60, and wherein the atom % of oxygen is from 10 to 30.

In other embodiments the antireflective coatings meet one of the following definitions:
- the atom % of silicon is from 20 to 32.5, wherein the atom % of carbon is from 5 to 55, and wherein the atom % of oxygen is from 20 to 62.5,
- the atom % of silicon is from 20 to 30, wherein the atom % of carbon is from 20 to 70, and wherein the atom % of oxygen is from 5 to 40;
- the atom % of silicon is from 20 to 30, wherein the atom % of carbon is from 20 to 60, and wherein the atom % of oxygen is from 10 to 40; or
- the atom % of silicon is from 20 to 30, wherein the atom % of carbon is from 45 to 55, and wherein the atom % of oxygen is from 20 to 25.

Optionally, additives such as levelling agents, inorganic, organic additives and carbon nanotubes, nano-diamonds, nano-crystals and similar can be added to the composition to further improve final coating properties or coating surface properties.

Particular embodiments of structures and processes are depicted in the attached drawings.

Turning first to FIG. 1, which shows a cross-section of a coated substrate, it can be noted that reference numeral shows a substrate 100 on top of which a material coating layer 110 has been arranged.

Figure 3:
FIG. 3 shows the cross-section of a typical sequence for coating deposition and curing to obtain single side coating.
Figure 3:
Figure 3:
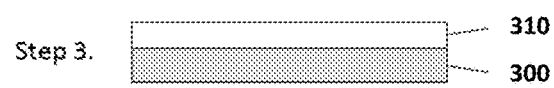

FIG. 3 shows a typical sequence of the deposition process of the material layer on top of the substrate. Step 1 includes substrate preparation, Step 2 includes the coating process and Step 3 includes the coating curing to its final form.

The substrate marked with reference numerals 100 and 300 in FIGS. 1 and 3 (and the corresponding substrates in the other Figures), can be soda lime glass, borosilicate glass or any other glass substrate type or plastic type with various thicknesses. The substrate can be non-tempered, thermally tempered glass or chemically tempered glass and it can have different surface preparations including polishing, grinding, washing together with or without various surface treatment agents. The substrate surface can be flat or can have a surface texture in it or other layers on the substrate with surface texture or no surface texture in it.

The material coating layer marked with reference numerals 110, 310 in FIGS. 1 and 3 (and the corresponding coating layers in the other Figures) is applied by using a wet chemical coating processes, preferably with spin-on, dip, spray, ink-jet, roll-to-roll, gravure, flexo-graphic, curtain, drip, roller, screen printing coating methods, extrusion coating and slit coating, but are not limited to these. After the wet chemical coating step there is an optional excess solvent removal step followed by a curing step using either thermal curing or UV curing or can be also combination of both. The thermal curing can be performed optionally in combination with the thermal tempering step of the glass.

Figure 2:
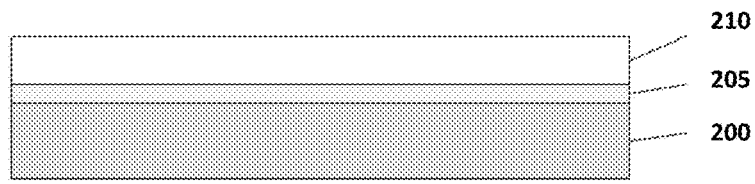
FIG. 2 shows the cross-section of a substrate 100 and material films 105 and 110.

FIG. 2 shows the use of an optional coating layer or surface treatment chemical 205 between the substrate 200 and material coating layer 210.

The coating layer 205 can be a primer layer activating the substrate 200 surface to achieve good adhesion between the substrate 200 and material coating layer 210. It can be alternatively also be a (patterned or non-patterned) coating layer providing example additional glass corrosion protection, diffusion barrier, conductive or semi-conductive coating layer or an optical coating layer playing the role of improving the optical properties of the total coating stack.

Figure 4A:
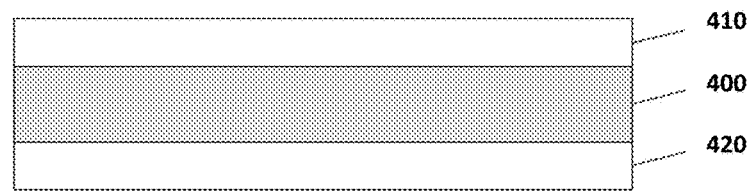
FIG. 4a shows the cross-section of a substrate 100 and material films 110 and 120.
Figure 4B:
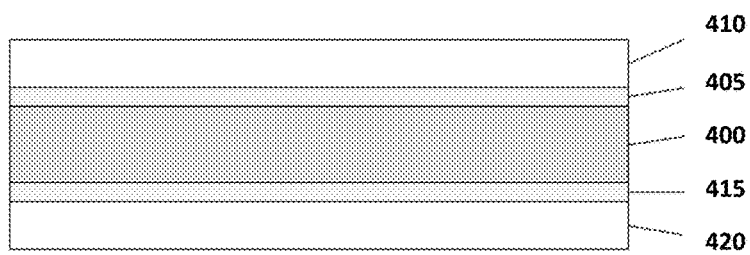
FIG. 4b shows the cross-section of a substrate 100 and material films 105, 110, 115 and 120.
Figure 5:
FIG. 5 shows the cross-section of a typical sequence for coating deposition and curing to obtain double side coating.
Figure 5:
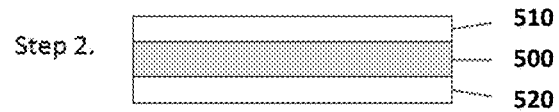
Figure 5:
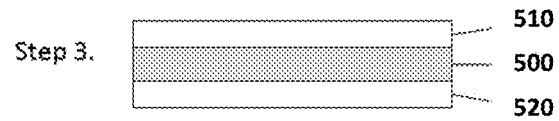

FIGS. 4a and 4b shows, similarly to FIGS. 1 and 2, cross-section representations of a substrate 400 but in this case the substrate is coated double sided with material coating layers 410 and 420. FIG. 5 shows, similarly to FIG. 3, a typical sequence of the deposition process of the material layer double sided on the substrate. Optionally, another coating layer or surface treatment chemical 505 and 515 can be used in between the substrate 500 and material coating layers 510 and 520.

The material coating layers 510 and 520 can be the same coating material or they can be different materials. The optional material coating layers or surface treatment chemicals 505 and 515 can be the same coating material or they can be different materials. If coating layers are different from each other and also depending on the used deposition technique there might be a need to do additional curing of the coating layer in between the deposition of each coating layer (after the wet chemical coating step there is an optional excess solvent removal step followed by a curing step using either thermal curing or UV curing or can be also combination of both. The thermal curing can be performed optionally in combination with the thermal tempering step of the glass).

Figure 6A:
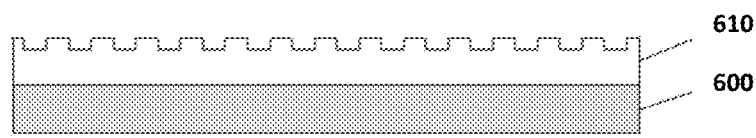
FIG. 6a shows the cross-section of a substrate 100 and patterned/structured material film 110.
Figure 6B:
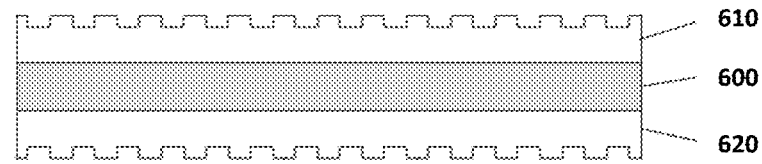
FIG. 6b shows the cross-section of a substrate 100 and patterned/structured material films 110 and 120.

FIG. 6a and FIG. 6b below show cross-section images of a substrate 600 and material coating layer 610 (single sided) and optionally having material coating layer 620 (double sided) on the substrate 600. In addition to the material layer, additional patterning process (nano-imprinting, embossing, roll-to-roll, gravure, flexo-graphic, roller, ink-jet, screen-printing, spray and or UV lithography is used as patterning process) is used the form surface structures (nano-scale or micro or millimeter scale) to the material film to produce additional optical, physical or chemical properties for to the material coating layer or coating layers.

Figure 7:
FIG. 7 shows the cross-section of a typical sequence for coating deposition, patterning and curing to obtain single side coating.
Figure 7:
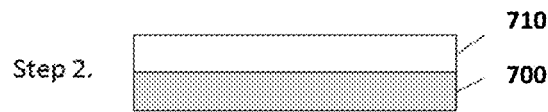
Figure 7:
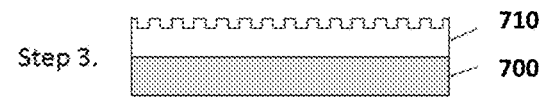
Figure 7:
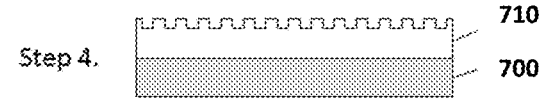

FIG. 7 shows a typical sequence of the deposition and patterning process of the material layer 710 on top of the substrate 700. Step 1 includes substrate preparation, Step 2 includes the coating process, Step 3 includes the patterning process of the material coating (this may include thermal and UV curing or combination of both) and Step 4 includes the coating curing for its final form. Step 2 and Step 3 can be combined as a one single step depending on the deposition and patterning technique. Optionally the layer 720 can be patterned on the rear side. It is also possible to have material layer 710 as non-patterned layer on top and then material layer 720 patterned on the rear side or vice versa.

The substrates described in FIG. 1-7 can be a cover substrate [or internal substrate(s)] in display device, touch screen device, photovoltaic device (cell, module, panel), semiconductor device, luminaire (LED, OLED, standard luminaires) and construction glass unit or similar. The substrate is typically glass but can be also plastic or polymer. As shown above the material coating layer(s) can be on the outside surface of the substrate or on the inside surface of the substrate.

Cover Glass Substrate Types:

There are a number of different cover glass types in the market what can be used in the above mentioned device assemblies. Available glass composition types are quartz glass, sapphire glass, soda-lime glass, borosilicate glass, aluminosilicate glass, lead silicate glass and aluminoborosilicate glass to mention few. There are three main glass manufacturing process types: the float process, the fusion overflow process and the slot down draw process. The glass what is used as a cover glass can be non-tempered, thermally tempered glass or chemically tempered glass and it can have different surface preparations including polishing, grinding, washing together with or without various surface treatment agents.

The float process is a typical one to manufacture the solar module cover glass. Optionally, in connection to the float process, a set of rollers are applied (rolled glass process) to provide a specific surface texture for the solar glass (textured glass).

The surface texture improves the optical performance of the cover glass in the solar module. Typically fine corrugations (texture) are used on the sunny side of the module glass and deeper corrugations (ranging from near pyramids to other texture) are used on the inside (facing the cells on the laminate side).

Most of the cover glass used in the crystalline silicon solar modules is textured glass (both non-textured and textured used). The cover glass used in the thin-film modules is mostly non-textured glass. For the flat plate thermal solar modules both textured and non-textured glass are used. When the glass exit's the float furnace it is cut to size (e.g. 1.6 m×1.1 m; typical crystalline silicon module size) and defect inspection is performed to verify glass bulk and surface quality.

After this typically minimum edge grinding and washing are applied prior going to a tempering furnace. Typically glass used in crystalline silicon modules is thermally tempered glass or chemically tempered glass. In case of thermally tempered glass the coating is applied before the substrate enters into the tempering furnace to receive the final cure and strengthening of the glass. In case of chemically tempered glass the glass is first chemically tempered after which the coating is applied and and glass and coating cured at max 350° C.: temperature. Typically, the used glass thickness ranges from 8 mm to 0.5 mm or potentially even thinner glass. The lower thicknesses are possible for the chemical tempering. Typically 1.0-2 mm is the limit for the glass thermal tempering to be successful. There are a number of different equipment types for performing the thermal tempering. There are also a number of different equipment types and methods to perform the chemical tempering for the glass. Optionally the glass is already thermally tempered glass (prior to the coating process) and only a lower temperature heat curing can be used to perform a final curing for the coating (otherwise the strengthening effect of thermal tempering will be lost). Also in case of using a non-tempered glass the coating can be just cured by using a lower temperature curing if tempering of the glass is not required. The AR coating is typically applied on "tin side" of the soda lime glass. In case of the solar thermal tubing the most commonly used glass is borosilicate glass.

Figure 8:
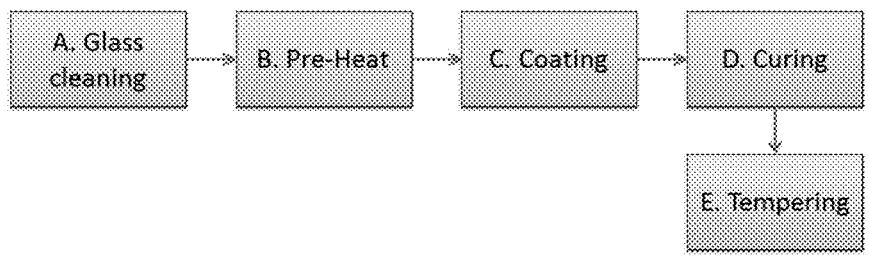
FIG. 8 shows a typical sequence for AR coating application on glass.

As an exemplary embodiment, a description of the glass coating process in case of crystalline silicon module (using a thermal tempering process) is illustrated below:

FIG. 8 shows a typical sequence for AR coating application on soda lime glass.

Step A. Glass cleaning: The glass cleaning is typically done using automated tool what uses DI-water+brushing/ultrasonic and may involve optionally usage of a cleaning agent or surface treatment agent. The used washing water may be also heated or at room temperature.

Step B. Pre-heat of the glass (optional): The glass cleaning step is followed by an optional pre-heating step of the glass. Preheating is applied to glass that is coming out from the glass cleaning unit. Temperature can be 100° C. to 200° C. and curing time 25 to 30 s, although these are no absolute limits. Optionally the washing water can be at elevated temperature and serve the function of preheating the glass.

Step C. Coating: After the optional pre-heat the liquid phase AR coating is deposited on the glass by using a roller coating tool (there are few different types of roller coater's; the parameters given here are for single side reverse roller coating tool). Typical parameters can include; conveyor speed 7 m/min, Coating roll target speed 6-7 m/min, Doctor roll speed same as coating roll and press roll speed 6.5 m/min.

A typical wet film thickness that the roller coating tool deposits on the glass substrate is about 8-15 micrometer in thickness (resulting in a typically desired final cured film thickness of 80-1.20 nm; dependent on the solids concentration of the coating material). The coating process needs to be carefully adjusted to result in uniform, defect free, high optical quality coating over the whole glass area. Coating formulation has a big impact on that how good quality coating can be achieved. Main factors are wettability of the glass surface, coating solvent boiling point and coating material viscosity.

The coating solution is typically a very dilute formulation, so the solvent plays a major role in these properties. Solid content for the coating solution ranges from 0.8% to 5.0%. Typical preferable viscosity range for the solution ranges of 1-5 cps, preferably 1.5-3.0 cps. The boiling point selection for the solvents ranges from 80° C. to 200° C. Also solvent mixtures can be used.

In addition to the above described roller coating, the material coating layer can be optionally applied by using other wet chemical coating processes, example spin-on, dip, spray, ink-jet, roll-to-roll, gravure, flexo-graphic, curtain, drip, roller, screen printing coating methods, extrusion coating and slit/slot coating, but are not limited to these.

Step D. Curing: After the coating step follows an optional curing step. The curing can be final curing for the coating if the tempering step is not applied. The temperature can vary in the range from 100° C. to 400° C. and the time can be from 30 seconds to 30 or even 60 minutes. The bake can be a continuously moving line furnace or similar. Also vacuum or forced air can be optionally used to drive of excess solvent prior to the curing. If tempering is applied as a following step, then the optional curing can be of a lower temperature with a short time to pre-cure the coating prior to the tempering.

Step E. Tempering: Thermal tempering of the glass is typically done by using a temperature in the range from 600° C. to 800° C. for a period of time (typically about 1 s up to 120 s). The tempering curing profile is dependent on glass thickness, tempering furnace type etc. The tempering can be followed by an additional DI water clean step and after that the coated glass is ready for module assembly or packing.

The whole line described above can be a fully automated processing of the glass pieces from one step to another or manual glass handling step(s) may be involved between the described steps. Furthermore the above coating function can be integral part of a glass manufacturing line or crystalline silicon module manufacturing line.

It is possible also to integrate the coating unit (example spray) into the actual float glass line. In this option the material would be deposited on a moving glass which is in the cooling stage coming out from the float furnace prior to or just after cutting.

Figure 9:
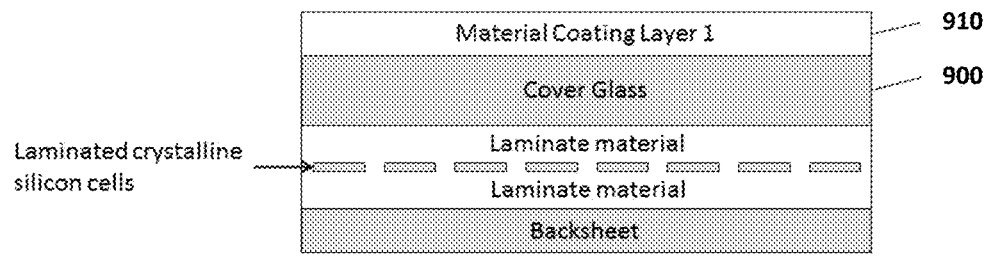
FIG. 9 shows a typical structure of crystalline silicon module.

FIG. 9 represents a typically structure of a crystalline silicon module.

As an exemplary embodiment, a typical construction and manufacturing of a crystalline silicon solar module is illustrated.

Silicon Wafer:

The raw material in making a solar cell is a silicon wafer, either a multicrystalline or monocrystalline silicon wafer. In monocrystalline silicon wafers, the whole piece is of one single crystal orientation. Multicrystalline silicon wafers contain multiple grains of various silicon crystal orientations as a result of its ingot growing process. The grain size is usually in the order of a few millimeters. The presence of these crystal grains on the multicrystalline wafer surface gives its distinctive appearance and the grains are visible by naked eye. Each grain consists of single crystal orientation.

Typically, the silicon wafers used in industry are p-type silicon wafers. Impurities in the form of boron atoms are typically introduced into the silicon crystal during ingot growing.

It is p-type because boron atoms have one less electrons in their outer shell compared to silicon, which means that it produces positive polarity. The minority carrier lifetime in p-type silicon measures how long an (negatively-charged) electron can survive on its own before it recombines with a (positively-charged) hole. Ideally the electrons must survive as long as possible and preferably long enough to have the chance to be collected by the p-n junction to contribute to the electrical current generated by the solar cell.

As mentioned before, the introduction of doping increases the electrical conductivity of the silicon material. The more boron atoms doped into the silicon, the higher the electrical conductivity of the silicon wafer (thus the lower the resistivity of the wafer). Wafer resistivity is an important parameter of the starting wafer because it determines the minority carrier lifetime of the wafer. More doping usually results in lower minority carrier lifetime and vice versa. For screen-printed solar cells with full Al BSF design, the optimum wafer resistivity value is about 1 ohm-cm.

Wafer thickness is another important parameter of the starting wafer. The thickness of a wafer is a main contributor to the mechanical strength of the solar cell. From the wafer production point of view, producing thinner wafers lead to cost savings. However, thinner wafers tend to lead to more breakages during processing, thus reducing the production yield. Besides the mechanical implications, the thickness of the wafer also has an effect on the electrical characteristic of the solar cell. Thicker wafers mean that they have more silicon to absorb light. However, this light-absorption effect becomes less important for very thick wafers because most of the light is actually absorbed within a few microns of the silicon wafer. Only the weakly absorbed low energy photons are absorbed towards the rear surface of the silicon wafer. The thickness of the wafer also has an effect on the importance of the rear surface passivation.

If the minority carriers (electrons in the case of p-type silicon) have a long enough lifetime such that it can travel and reach the rear surface of the silicon wafer, then rear surface passivation becomes very important. However, if the minority carriers does not have long enough lifetime to reach the rear surface of the silicon (either because the wafer is too thick or because the minority carrier lifetime is too short), then the rear surface passivation is no longer important. This is because no recombination at the rear surface can occur if no minority carriers (electrons) reach the rear surface.

Usually in industry, 156 mm×156 mm or 125 mm×125 mm size wafers are used. For the same wafer thickness, larger wafer sizes tend to reduce the mechanical strength of the wafer. This leads to potentially more wafer breakages during processing. However, from manufacturing cost point of view, it is preferable to have larger wafer sizes because the cost structure is more a factor of the number of cells processed rather than the size of the cells processed. From electrical point of view, larger size cells require the generated electrical current to travel longer distances across the wafer to be extracted out of the device. This has implications when designing the front metal fingers and busbars for the front surface contact.

Saw Damage Etch (SDE) and Surface Texturing:

The purpose of the SDE process is to remove all the saw damage caused by the sawing process when wafers are cut from their ingot block. The sawing process uses a strong mechanical force in the form of thin metal wires rotating at very high speed. Due to this excessive force, the resulting wafer surface is very rough and has cracks penetrating deep into the wafer. The SDE aims to remove the damaged surface layer as well as any organic/metal residue left on the wafer surface. This ensures a clean and no-defect surface is present for subsequent processing. The purpose of the texturing process is to roughen the wafer surface in order to reduce the overall surface reflection of the wafer. Planar silicon wafer is roughly about 30% reflective. This means that 30% of the light that falls on the surface is reflected away. If the wafer surface is less reflective, these lights have the chance to be absorbed in the silicon wafer and might contribute to the current generated by the solar cell.

The SDE/texturing process for multicrystalline wafers uses a mixture of two chemicals: hydrofluoric acid (HF) and nitric acid ($HNO_3$). Sometimes deionised water ($H_2O$) or acetic acid ($CH_3COOH$) can be added to the mixture for a more stable etching. This etchant is widely used in semiconductor fabrication as an etchant for silicon. This etch is isotropic meaning that it etches silicon at the same rate in all direction, regardless of crystal orientation. This chemical mixture is also known as HNA etch (hydrofluoric nitric acetic) or acid etch (because it contains acidic solutions) or iso-etch (because it is isotropic).

Emitter Diffusion:

The purpose of the emitter diffusion process is to introduce doping or impurities of a different polarity to the silicon wafer in order to create a p-n junction (or a diode). For a starting p-type (positive polarity) wafer, this means that the emitter must be of n-type (negative) polarity. Phosphorus atoms are commonly used as an n-type dopant to produce this n-type emitter. The p-n junction (the interface where the two opposite polarities meet) functions as a collector of the minority carrier, which is essential for the solar cell operation.

A solar cell is in essentially a p-n junction or a diode with an electrode on each side of the polarity (negative and positive). In solar fabrication, the method used to introduce n-type impurities (phosphorus) is called a solid-state diffusion process. It is solid-state because there are two solids (silicon on one side and a phosphorus-containing layer on the other side) that are intimately in contact with each other. The phosphorus must essentially diffuse (or move) from one side of the solid to the other side. As can be imagined, forcing an atom to move from solid to solid requires very high energy input. The energy is usually supplied in the form of heat energy, which is the reason why solid-state diffusion process must be performed at very high temperatures (800-1000° C.).

Typically there are two wafer parameters that are characterized after the completion of the emitter diffusion process: (1) minority carrier lifetime and (2) emitter sheet resistance.

As mentioned before, the diffusion process involves high temperature which has the potential of reducing the minority carrier lifetime if any contamination is driven into the silicon wafer during this process. Therefore, monitoring the minority carrier lifetime after the process is important for quality control. The emitter sheet resistance (SHR) is basically a measure of the resistivity of the emitter (n-type) layer.

Edge Junction Isolation:

The purpose of the edge junction isolation process is to remove any n-type silicon layers from the edge and the rear of the solar cell. During the phosphorus diffusion process, it is inevitable that some phosphorus also diffuse on the edges and to a lesser extent, the rear side of the wafer. These 'unwanted' n-type layers on the edges and the rear of the wafer provide conductive path for electrons to flow from the front side n-type emitter layer to the rear p-type layer. This effect is detrimental to the performance of the solar cell because these electrons should have travelled to the metal contacts to be extracted out of the device. The chemical used in this process is the same as SDE/Texturing process, which is $HF/HNO_3$ mixture but with lower concentration. This chemical etches a few microns of the silicon on the rear side and to a lesser degree on the edges of the wafer. Inevitably, some etching also occurs on the edges of the front side. This front side etching should be minimized as much as possible.

Phosphosilicate Glass (PSG) Removal:

It is a purpose of the PSG removal process is to remove the residual PSG (phosphosilicate glass) layer or $P_2O_5$ (phosphorus pentoxide) layer from the top surface that is leftover from the diffusion process (see the above description on the diffusion process to recall why PSG is present on the top surface).

Although the PSG layer is a thin-film dielectric layer (it's basically a layer of phosphorus-rich oxide), there are two main reasons why this PSG layer is unwanted on the top surface of the wafer: 1. The PSG layer on top of the silicon wafer surface does not provide good anti-reflection properties. Therefore, this PSG layer needs to be completely removed before a dielectric layer with better anti-reflection properties (such as SiN) is deposited. 2. The PSG layer on top of the silicon wafer surface does not provide good surface passivation properties. Therefore, this PSG layer needs to be completely removed before a dielectric layer with better surface passivation properties (such as SiN) is deposited.

Unlike SiN, PSG does not contain atomic hydrogen required for bulk passivation of grain boundaries in multicrystalline wafers. The HF etches the PSG layer thus removing all traces or residue of phosphorus oxide thin film layer from the front surface. If the etching process is successful, then ideally the Si surface is exposed after the entire PSG layer has been completely removed ready for the SiN to be deposited on top of the silicon surface.

Silicon Nitride (SiN) as Cell Surface Anti-Reflective Coating:

The purposes of the deposition of silicon nitride (SiN) thin dielectric film on the top surface of the wafer are, for example, the following: 1. It acts as an anti-reflection coating on the front surface of the solar cell, which reduces the reflection of incoming light. 2. It provides front surface passivation of the solar cell, which reduces the recombination on the front surface of the solar cell. 3. It contains a large concentration of atomic hydrogen, which can be released when subjected to high temperature treatment (such as when firing the metal) and provide bulk passivation on multicrystalline wafers, especially in the grain boundaries. The most common way of depositing silicon nitride (SiN) thin dielectric film on the front surface of a solar cell is by a method called PECVD (Plasma-enhanced Chemical Vapor Deposition). As its name suggests, the chemicals used to form SiN are deposited as vapors or gas. Since SiN contains both silicon (Si) and nitrogen (N), the source gases must contain these two elements.

Aluminium and Silver Metallization:

The main purpose of the screen-printing process is to apply the metal electrodes on both the front (n-type contact) and the rear (p-type contact) of the solar cell. These electrodes are critical in extracting the electrical current (electrons) generated by light out of the solar cell. Therefore, the electrodes must have as small resistance as possible. There are two metals commonly used in screen printed solar cells. The first one is silver (Ag) and the other one is aluminum (Al). There are various different types of paste material ranging from conventional larger particle size pastes to nano-meter sized granular size metal pastes. Ag is usually applied for the n-type contact electrode and Al is usually applied for the p-type contact electrode. This is because Al makes a very good (low resistance) contact to p-type silicon but not to n-type silicon. On the other hand, Ag can make a good contact to both n-type and p-type silicon. Furthermore, Ag is a highly conductive material (although expensive). Al is less conductive than Ag but still very conductive. Al is chosen for the rear side p-type contact because Al is also a p-type dopant which helps create the necessary back surface field (BSF) on the rear side for rudimentary rear surface passivation.

The most common way of applying metal electrodes for industrial solar cells is screen printing. The metal has to be in the form of paste in order to be screen-printable. The screen design is extremely important in a screen-printing process. The screen is usually mounted on an aluminium frame for easy handling and for structural integrity. A high tension stainless steel mesh is then attached on the frame. Below the mesh is an emulsion layer with a certain thickness. The emulsion is usually made of polymer material that is patterned according to the desired pattern. The screen-printing process deposits the metal pastes on the top and rear surfaces of the solar cell.

After deposition, these metals do not make any electrical contact with the underlying silicon surfaces. Only after firing (the next process step) that this low-resistance electrical contact is formed between the metal and the silicon. The screen-printing process merely positions the appropriate metals where the contacts are to be made. The process is typically evaluated by visual inspection (both by naked eye and by optical microscope) of the screen-printed lines (on the front surface) and of the rear surface lines.

The most important parameter to look at for the front surface grid lines are: (1) uniformity of width and height across the entire front surface, (2) check if any breaks along the fingers and (3) positioning of the metal fingers on the front surface area. For rear surface printing, alignment between the Ag/Al busbar strips and the Al full area is important to check as well as the overall alignment between the printed metal and the wafer surface.

Silver and Aluminium Co-Firing:

The main purpose of the firing process is threefold: (1) to form contact between silver (Ag) and the n-type silicon emitter layer; (2) to release atomic hydrogen (H) from SiN to the silicon wafer for bulk passivation of multicrystalline silicon; and (3) to form contact between aluminium (Al) and the p-type silicon base and form the Al BSF layer for rear surface passivation.

The firing process subjects the wafer to a quick high temperature treatment (rapid thermal anneal), which activates the metal and makes it react with the silicon. The metal paste usually contains glass frit which increases the aggressivity of the metal paste. The glass frit enhances the ability of the metal paste to fire through any dielectric layer that may be present in between the metal and the silicon. The high temperature treatment also allows the metal to make a good ohmic contact with the silicon.

Silver and silicon in contact with each other begin to melt and form an alloy at around 840° C. Therefore, the firing temperature has to reach at least this temperature in order for the silver to form an ohmic contact with the n-type emitter layer. The firing of the silver metal paste is a very critical process with a narrow process window. Atomic hydrogen is released from the SiN film to the silicon wafer when subjected to high temperature during firing. The heat energizes the hydrogen atoms and allows them to move freely. The duration of heat treatment strongly affect the degree of release of atomic hydrogen from the SiN.

For the aluminum contact, p-type silicon and aluminum usually makes a very good ohmic contact even when sintered only at low temperatures. The alloying of silicon and aluminum begins to occur at the "eutectic temperature" which is 577° C. Above this temperature, silicon and aluminum will melt and begin to alloy with each other. During cool-down, an epitaxial re-growth of aluminium doped p-type silicon at the rear begins, which results in a heavily-doped p+-type silicon layer, otherwise known as the back surface field (BSF).

There are also number of other types of solar cell manufacturing methods and variations in material selection and structures are vast.

Solar Module Assembly:

The assembly of a module, in its most simplified form, typically comprises to stage: The first stage is the construction of the laminate with the cover glass, cells and encapsulation materials and the backsheet; and the second is the construction of the solar module with the framing, junction box, and packaging components.

The cells can be connected in a variety of ways. They can be connected in an automated fashion, by hand, or some combination of the two. The stringing process is an automated process and includes only the process of taking raw material and producing a string of e.g. 10 cells connected electrically in series. Raw materials for the stringing process include cells, flux, and ribbon. Lay-up occurs after stringing. Lay-up places the strings next to each other on the solar laminate and then connects each of the strings via cross connectors so that the strings are in series with each other.

In some embodiments, a layer of ethylene vinyl acetate (EVA) is fitted between the crystalline silicon and the substrate.

Lamination is one of the most important processes in the module factory. A photovoltaic laminator encapsulates the solar modules by curing the EVA at approximately 150° C. for approximately 20 minutes under vacuum. EVA is initially opaque and doesn't exhibit the desired properties until melted and cured under vacuum. Once melted, the EVA begins to harden and cure to enhance the module's strength. The purpose of encapsulating solar modules is to provide a transparent structural support of the solar cells and provide electrical isolation between the cells. Also other lamination materials can be used either in film form or in liquid form to provide encapsulation of the solar modules.

After lamination, the laminate will be trimmed and then have a junction box placed on it. Trimming the EVA and backsheet from the glass edge is a process that affects many downstream processes. The quality of the trimming process can adversely affect each of the downstream processes that involve the edge of the glass. These include locating the module, applying the edge tape, and installing the frame followed by final characterization of the module and packing. The module glass can be thick glass or thin glass thickness ranging from 0.7 mm to 8 mm. Or even thicker or thinner glass can be considered. The backsheet can be a polymer film based backsheet, metal and in some cases additional (or instead of a polymer backsheet or metal) thin glass can be laminated also on the backside of the module.

Figure 10:
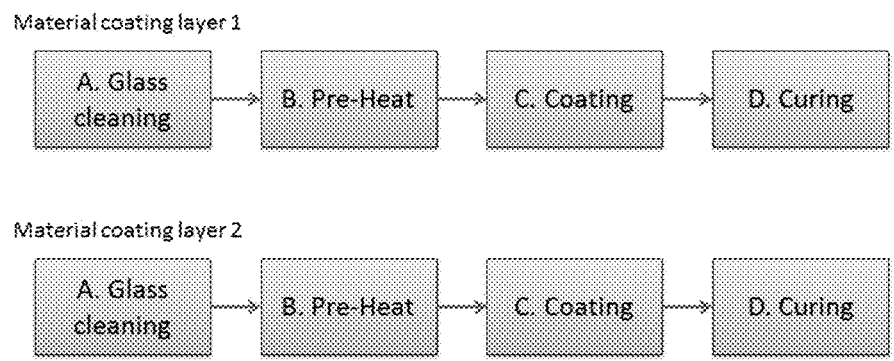
FIG. 10 shows a typical sequence for AR coating application on glass for a thin-film solar module.

FIG. 10 shows a typical sequence for AR coating application on sodalime glass for a thin-film module. As an exemplary embodiment, coating application on glass is illustrated below:

The cover glass of the thin film module that is to be coated can have already a Transparent Conductive Oxide (TCO) coating on it or is blank non-TCO coated glass. Furthermore, the glass can be pre-tempered or non-tempered glass. There exists flatness requirement for the glass and this sets limitations in terms of pre-tempered glass usage. Pre-tempered glass has also maximum heat limitation at about 350-400 C that can be applied for curing of the pre-tempered glass. A tempering process is not typically applied for the thin-film process cover glass. If chemically tempered glass is used the flatness is not an issue, but similarly maximum in cure temperature is around 350° C. that can be used in coating curing.

Step A. Glass cleaning: The glass cleaning is typically done using automated tool what uses DI-water+brushing/ultrasonic and may involve optionally usage of a cleaning agent or surface treatment agent. The used washing water may be also heated or at room temperature.

Step B. Pre-heat of the glass (optional): The glass cleaning step is followed by an optional pre-heating step of the glass. Preheating is applied to glass that is coming out from the glass cleaning unit. The temperature can be between 100° C. and 200° C. and the curing time 25 to 30 s. Optionally the washing water can be at elevated temperature and serve the function of preheating the glass.

Step C. Coating: After the optional pre-heat the liquid phase AR coating is deposited on the glass by using a roller coating tool (there are a number of different types of roller coater types; the parameters given here are for single side reverse roller coating tool). Typical parameters can include; conveyor speed 7 m/min, Coating roll target speed 6-7 m/min, Doctor roll speed same as coating roll and press roll speed 6.5 m/min. A typical wet film thickness what the roller coating tool deposits on the glass substrate is about 8-15 micrometer in thickness (resulting in a typically desired final cured film thickness of 80-120 nm; depending on the solids concentration of the coating material).

The coating process needs to be carefully adjusted to result in uniform, defect free, high optical quality coating over the whole glass area. The formulation of the coating composition has a big impact on that how good quality coating can be achieved. Main factors are wettability of the glass surface, coating solvent boiling point and coating material viscosity. The coating solution is typically a very dilute formulation, so the solvent plays a major role in these properties. Solid content for the coating solution ranges from 0.8% to 4.0%. Typical preferable viscosity range for the solution ranges in between 1-5 cps. The boiling point selection for the solvents ranges from 80° C. to 150° C. In addition to the above mentioned roller coating, the material coating layer can be optionally applied by using other wet chemical coating processes, example spin-on, dip, spray, ink-jet, roll-to-roll, gravure, flexo-graphic, curtain, drip, roller, screen printing coating methods, extrusion coating and slit/slot coating, but are not limited to these.

D. Curing: After the coating step follows a curing step. The temperature can range between 200° C. to 400° C. and a time between 30 seconds and 30 minutes. The bake can be a continuously moving line furnace or similar. Also vacuum and/or air can be optionally used to drive of excess solvent prior to the curing. If optional layer of material is applied on the rear side of the glass the cycle is repeated as described in FIG. 10 and described above. It is possible to use means of protection for the already deposited substrate size to prevent contamination or damage if necessary.

Figure 11:
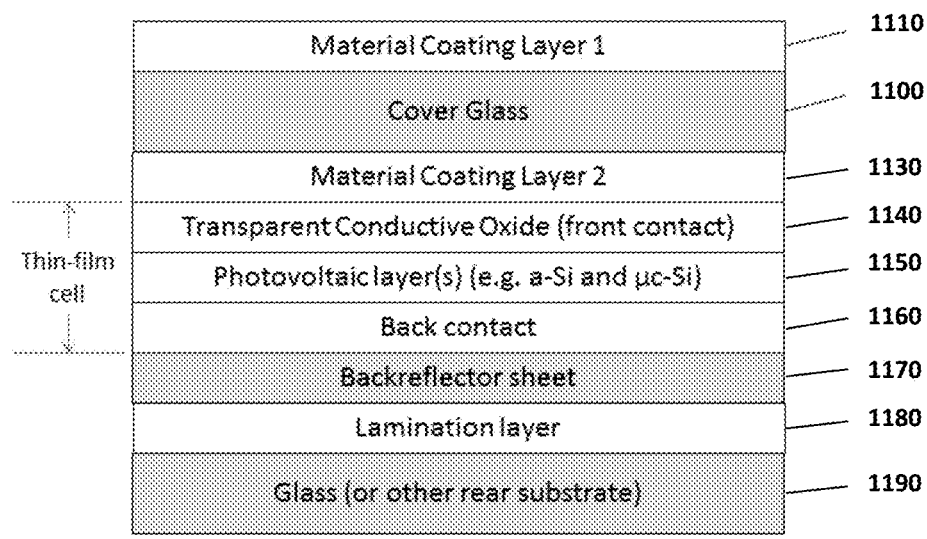
FIG. 11 shows a typical structure of thin-film solar module.

After the coating/coatings application steps the glass continues forward to the front electrode etc deposition steps as shown in FIG. 11 (and later on in the text).

The whole line described above can be a fully automated processing of the glass pieces from one step to another or manual glass handling step(s) may be involved between the described steps. Furthermore the above coating function can be an integral part of a glass manufacturing line or a thin-film module manufacturing line.

Based on the above, a method for forming a solar panel, comprises in one embodiment the steps of
  providing a first transparent planar substrate having a first side and an opposite second side;
  depositing on the first side of the substrate a first antireflective coating;
  forming on the second side of the first substrate:
    a first transparent conductive layer,
    at least one active layer for absorbing light and separating charge carriers, and
    a second transparent conductive layer; and
  bonding a second transparent substrate to said second conductive layer so as to form a solar panel.

Typically, prior to forming the first transparent conductive layer, an optional second antireflective coating is formed on the second side of the glass or plastic substrate.

Preferably, the first antireflective coating has a pencil hardness of at least 4H, and the second antireflective coating has a pencil hardness smaller than that of the first antireflective coating.

In the afore-going embodiments, the first and second transparent conductive layers may comprise indium tin oxide, tin oxide or zinc oxide. They may also comprise doped oxides of the indicated kind, e.g. the corresponding metal oxides doped with fluorine or aluminium.

In the above embodiments, the first electrode can be a multilayered structure comprising overlapping layers of F doped tin oxide and Al doped zinc oxide. The second electrode can be formed by a multilayered structure comprising at least one layer of a pure metal, such as silver, and at least one layer of a metal oxide, such as zinc oxide, optionally doped with aluminium.

In one embodiment, the second antireflective coating has a surface topography capable of increasing light trapping.

The at least one active layer may comprise amorphous, polycrystalline or crystalline silicon. The at least one active layer may also comprise cadmium telluride, or copper indium gallium selenide.

Preferably, in the above disclosed technology, the active layer forms an organic solar cell or a quantum dot solar cell.

In a preferred embodiment, the second antireflective coating may comprise metal oxide. Thus, for example, in the second antireflective coating, the content, in terms of atom %, of metal is from 1 to 40, for example 20 to 30, wherein the atom % of silicon is 0 or up to 15, wherein the atom % of carbon is from 5 to 30, and wherein the atom % of oxygen is from 5 to 60.

In preferred embodiment, the second antireflective coating, is formed by using metaloxide (titanium, tantalum, germanium, aluminium, zirconium or similar oxide) polymers. Such polymers can be made purely from one metaloxide type or can be mixtures of two or more. Furthermore the metaloxide polymer can have organic functionalities and can also contain silicon polymer, synthesised to the matrix or mixed as a separate polymer to form the prepolymer coating formulation. Table 2 lists characterization results for glass substrates coated and cured with the compositions and prepolymer formulations shown by exemplary embodiments, material synthesis examples 16-29, below.

A refractive index of about 1.45 to 2.1 can be reached by using either pure metal oxides or mixed metal oxides or combinations of silicon and metal oxides. An exemplary embodiment, of a typical configuration of thin-film solar module is shown in FIG. 11.

As an exemplary embodiment of a device structure, below is given a detailed description of a typical construction of a one thin-film based solar module type as well as of the manufacture thereof.

Amorphous Silicon Solar Cell:

Amorphous silicon (a-Si) is the non-crystalline form of silicon. It is one of the well-developed thin film technologies which has been on the market for number of years. Compared with crystalline silicon solar cells technology, features typical for a-Si solar cells are as follows:

The technology is relatively simple and inexpensive for a-Si. For a given layer thickness, a-Si absorbs much more energy than c-Si (about 2.5 times). Much less material required for a-Si films, lighter weight and less expensive. It can be constructed on a wide range of substrates, including flexible, curved, and roll-away types. Typically substrate is glass because of the encapsulation. Its overall efficiency is around 10-15%, which is still lower than for crystalline silicon but improving. There are so called single junction and tandem junction versions available. Compared with Single Junction, Tandem Junction can absorb more light delivering higher efficiency. Amorphous-Si absorbs Blue/Green light, Microcrystalline-Si absorbs Red/IR, Tandem junction combines them together, absorbing both visible and IR spectrum.

Unlike wafer-based solar modules, thin-film solar cells can be manufactured directly on a glass substrate as a large-scale solar power module. The process flow can be described as follows (to give merely a general representation of the process):

1. A bare glass substrates front surface (tin side) surface is coated as described above by using material coating layer 1 followed by coating curing. Optionally also the rear surface is coated with material coating layer 2 followed by coating curing. Optionally the substrate has already TCO coating on the rear surface of the glass. In this case only material coating layer 1 is deposited to the front side of the glass.
2. TCO layer is deposited as the front contact for the module (in case of already TCO coated glass no need for the TCO deposition step).
3. Substrate cleaning, TCO-coated glass is cleaned (also additional clean steps may be applied after the following steps).
4. Cutting with laser, Laser scribe ($1^{st}$). After cleaning, the TCO pattern for the separated front electrodes of individual cells is formed by using a laser scriber according to the required output current and output voltage.
5. Substrate (TCO-coated glass) cleaning after laser cutting by using a Glass Washer.
6. Pre-heat.
7. Deposition of thin-film Si, PECVD System for a-S/μc-Si deposition. With the separated front electrode, the active layer of the photovoltaic material is deposited by using the PECVD. In the case of the tandem Si thin film solar cells, the active layer includes the amorphous silicon ("a-Si") p-i-n layer and microcrystalline silicon ("c-Si") p-i-n layer.
8. Cool down the glass substrates.
9. Cutting of thin-film Si, Laser Scribe ($2^{nd}$, green), the second laser patterning for the separated active layers of individual cells.
10. Sputtering of back electrode. After the second laser patterning, the back contact electrode is coated by using a sputter.
11. Cutting of back electrode, Laser Scribe ($3^{rd}$, green). Substrates are scribed into each individual cell.
12. The edge deposition is deleted and cleaned for subsequent module encapsulation.
13. Test by solar simulator.
14. Module encapsulation. There are three important processes for module encapsulation, including lay-up contacting for the conductive integration of the junction box, the lamination with a piece of backsheet or back glass, and the installation of the junction box.
15. The process of a solar cell module is finished by the final sealing or framing. The properties of the complete module are assured by using a solar simulator as the final station of the module assembly.

It should be noted that the above is merely one example of a thin-film based solar module construction, and that alternative constructions and methods are fully encompassed by the present technology.

Alternative types of solar modules include thin-film solar module types with layers of cadmium telluride, copper indium gallium selenide; other thin-film silicon based types; dye-sensitized and organic solar cells; as well as other similar to the afore-going.

The above two examples describe the usage of the product in crystalline silicon and thin-film silicon solar modules. The same principle for achieving an efficiency improvement applies for the concentrated solar modules and thermal solar modules for both tube version and flat plate versions and also on concentrated tube version of thermal solar modules/units. In the latter case it is beneficial to use the antireflective coating on both sides of the substrate and employ on both sides the low refractive index antireflection coating version of the present materials.

Figure 12:
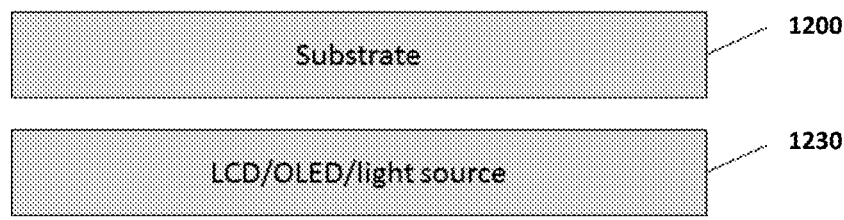
FIG. 12 shows the cross-section of a display device where a cover substrate is coated on one or both sides.

An exemplary embodiment of a display device, luminaire cover or construction glass is given in FIG. 12.

FIG. 12 shows the cross-section of a display device where a cover substrate (substrate 1200) is coated either from single side or from both sides.

Again if an air gap is present between the cover substrate (substrates 1200) and rest of the display unit it is beneficial to have low refractive index coating on the rear side of the device. If the device cover substrate (substrate 1200) combines a touch sensor on the rear side of the cover substrate it is beneficial again to use a higher refractive index layer at the rear side between or on top of the ITO conductor pattern for reflection matching optimization function. It is possible also to use earlier described thin film solar module (in cover substrate size) as the cover substrate in a display device. The full thin-film solar module stack has to be optimized in terms of transmission and minimize reflection losses. Again for this display integrated thin-film solar module and also for the rear substrate, additional reflection matching or AR layers can be used. Optionally the thin-film active area can be designed the way it covers the edge area of a display cover substrate (e.g. taking use of the typical black matrix or white matrix area).

The luminaires are other example where it is beneficial to use double side AR layer on the cover substrate (substrate 1200) of a luminaire unit. Maximum out coupling of light is beneficial to minimize the reflection losses from the cover substrate can be achieved by using antireflection coating on both sides of the cover glass (substrate 1200). The luminaire can be an LED luminaire, OLED luminaire or a regular luminaire with a cover substrate. If the device cover substrate (substrate 1200) is at the same time substrate where the OLED is constructed on the rear side, it is beneficial to use a higher refractive index layer at the rear side between the substrate and the first OLED electrode for reflection light out-coupling optimization function.

Similarly the coating(s) can be applied for construction or regular glass to minimize reflections and increase transmission and provide easy clean, durable surfaces. In this case substrate 1200 would be used (without 1230) as a single glazing (or part of double or triple glazing) unit in window frame and element.

Typical qualification test requirements for a solar module include:
  Damp heat steady state test of module with coated glass (Constant +85° C. and 85% relative humidity for 1000 hours)
  Temperature cycling testing of module with coated glass (Cycles: −40° C. to +85° C. for 200 cycles)
  Humidity freeze test of module with coated glass (−40° C. to +85° C. at 85% relative humidity for 10 cycles)

As a pass criteria for tests are that the optical, mechanical and other physical properties of the coating should not change after the test. Table 1 lists characterization results and represents stability of antireflection (minimal change in average transmission gain) and stability of the water contact angle when measured before and after the damp heat steady state test (1000 h at constant +85° C. and 85% relative humidity) of a glass substrate coated and cured with the compositions and prepolymer formulations shown by exemplary embodiments, material synthesis examples 1-15, below.

Synthesis and polymerization of hybrid organic-inorganic siloxane polymers are carried out such that compositions are obtained which have properties which make them suitable for use as single layer coatings with combined high anti-reflection, high hardness, adhesion, scratch resistance and anti-soiling and cleanability properties, on the device substrate surfaces. Furthermore, the compositions provide durability of the described properties after the typical qualification test.

In one embodiment, the siloxane polymers are synthesized using silane monomers and in particular combinations of silane monomers as starting materials.

The precursor molecules of the siloxane polymers can be tetra-, tri-, di-, or mono-functional molecules. A tetra-functional molecule has four hydrolysable groups; a tri-functional molecule has three hydrolysable groups; a di-functional molecule has two; and mono-functional molecule has one. The precursor molecules, i.e. silane monomers can have organic functionalities. The precursor molecules can be also bi-silanes.

The liquid phase coating solution is formulated using the polymer, a solvent or a solvent mixture, optionally additives or catalysts and additional processing aids, if necessary.

The wet chemical coating is prepared from this coating solution by any typical liquid application (coating) processes, preferably with spin-on, dip, spray, ink-jet, roll-to-roll, gravure, flexo-graphic, curtain, drip, roller, screen printing coating methods, extrusion coating and slit coating, but are not limited to these. After the final curing process step, the coating shows excellent mechanical coating properties, including adhesion and hardness, i.e., scratch and wear resistance, together with excellent resistance against various essential environmental conditions, both enabling its use in demanding applications applied as a very thin layer on thin glass.

From the chemical point of view, this coating is optimized to show moderate hydrophobic and oleophobic characteristics in balance, homogeneously through the coating matrix, the balance between these characteristics in line with the long-term effect is taken into account. Moreover, the coating layer is a single layer system that is built up so that it shows optically optimized anti-reflective characteristics, in addition to the easy-to-clean properties. Due to the tuned chemical composition and anti-reflectivity, together with the chemical homogeneity and thin physical character of the coating, the clear nature and the color repeatability of the glass is sustained, highly preferred in the field of the applications. Due to the chemically and physically homogenous nature of the coating, the mechanical durability is achieved, and long-term time frame of the effect is sustained.

According to one embodiment, the process according to the invention comprises hydrolyzing and polymerizing a monomers according to either or both of formulas I and II:

$$R^1_a SiX_{4-a} \qquad \text{I}$$

and $$R^2_b SiX_{4-b} \qquad \text{II}$$

wherein $R^1$ and $R^2$ are independently selected from the group consisting of hydrogen, linear and branched alkyl and cycloalkyl, alkenyl, alkynyl, (alk)acrylate, epoxy, allyl, vinyl and alkoxy and aryl having 1 to 6 rings; each X represents independently a hydrolysable group or a hydrocarbon residue; and a and b is an integer 1 to 3.

Further, in combination with monomers of formula I or II or as such at least one monomer corresponding to Formula III can be employed:

$$R^3{}_cSiX_{4-c} \quad \text{III}$$

wherein $R^3$ stands for hydrogen, alkyl or cycloalkyl which optionally carries one or several substituents, or alkoxy;

each X represents independently a hydrolysable group or a hydrocarbon residue having the same meaning as above; and c is an integer 1 to 3.

In any of the formulas above, the hydrolysable group is in particular an alkoxy group (cf. formula IV).

As discussed above, the present invention provides for the production of organosiloxane polymers using tri- or tetraalkoxysilane. The alkoxy groups of the silane can be identical or different and preferably selected from the group of radicals having the formula $$-O-R^4 \quad \text{IV}$$

wherein $R^4$ stands for a linear or branched alkyl group having 1 to 10, preferably 1 to 6 carbon atoms, and optionally exhibiting one or two substitutents selected from the group of halogen, hydroxyl, vinyl, epoxy and allyl.

In one embodiment, the present method comprises using at least one bisilane monomer for producing a homopolymer, or a copolymer together with other monomers, for example such as one or more of the ones according to formulas I to III, or for producing a homopolymer or copolymer, which is blended or compounded with polymers not containing said bisilane monomer.

According to a preferable embodiment the bisilane is preferably selected from molecules corresponding to formula VI:

$$(R^6)_3Si-Y-Si(R^7)_3 \quad \text{VI}$$

wherein $R^6$ and $R^7$ are independently selected from hydrogen and a group consisting of linear or branched alkyl, cycloalkyl, alkenyl, alkynyl, (alk)acrylate, epoxy, allyl, vinyl, alkoxy and aryl having 1 to 6 rings, and wherein the group is substituted or unsubstituted; and Y is a linking group selected from unsubstituted and substituted bivalent aliphatic and aromatic groups, such as alkylene, arylene, —O-alkylene-O—; —O-arylene-O—; alkylene-O-alkylene, arylene-O-arylene; alkylene-$Z^1$C(=O)$Z^2$-alkylene, arylene-$Z^1$C(=O)$Z^2$-arylene and —O-alkylene-$Z^1$(=O)$Z^2$-alkylene-O—; —O-arylene-$Z^1$(=O)$Z^2$-arylene-O—, wherein $Z^1$ and $Z^2$ are each selected from a direct bond or —O—, Exemplary bisilanes include 1,2-bis(trimethoxysilyl)methane, 1,2-bis(triethoxysilyl)methane, 1,2-bis(trimethoxysilyl)ethane, 1,2-bis(triethoxysilyl)ethane, 1-(dimethoxymethylsilyl)-1-(trimethoxysilyl)methane, 1-(diethoxymethylsilyl)-1-(triethoxysilyl)methane, 1-(trimethoxymethylsilyl)-2-(dimethoxysilyl)ethane, 1-(dimethoxymethylsilyl)-2-(trimethoxysilyl)ethane, 1-(diethoxymethylsilyl)-2-(triethoxysilyl)ethane, bis(dimethoxymethylsilyl)methane, bis(diethoxymethylsilyl)methane, 1,2-bis(dichloromethylsilyl)ethane, 1,2-bis(trichlorosilyl)ethane, 1,2-bis(dimethoxymethylsilyl)ethane, 1,2-bis(diethoxymethylsilyl)ethane, 1,2-bis(trimethoxysilyl)benzene, 1,2-bis(triethoxysilyl)benzene, 1,3-bis(trimethoxysilyl)benzene, 1,3-bis(triethoxysilyl)benzene, 1,4-bis(trimethoxysilyl)benzene, 1,4-bis(triethoxysilyl)benzene.

Further examples include: 4,4'-Bis(triethoxysilyl)-1,1'-biphenyl; 1,4-Bis(triethoxysilyl)benzene; 1,3-Bis(triethoxysilyl)benzene The above precursor molecules are condensation polymerized to achieve the final siloxane polymer composition. Generally, in case of tri-, di- and mono-functional molecules, the other functional groups (depending on the number of hydrolysable group number) of the precursor molecules can be organic functionalities such as linear, aryl, cyclic, aliphatic groups. These organic groups can also contain reactive functional groups e.g. amine, epoxy, acryloxy, allyl or vinyl groups. These reactive organic groups can optionally react during the thermal or radiation initiated curing step. Thermal and radiation sensitive initiators can be used to achieve specific curing properties from the material composition.

Particularly suitable monomers are selected from the group of triethoxysilane, tetraethoxysilane, tetramethoxysilane, methyltrimethoxysilane, methyltriethoxysilane, ethyltriethoxysilane, n-butyltriethoxysilane, methyldiethoxyvinylsilane, n-octadecyltriethoxysilane, dimethyldiethoxysilane, vinyltriethoxysilane, vinylmethyldimethoxysilane, phenyltrimethoxysilane, phenantrene-9-triethoxysilane, vinyltrimethoxysilane, 3-glysidoxypropyltrimethoxysilane, aminopropyltrimethoxysilane, methacryloxypropyltrimethoxysilane, methacryloxypropyltriethoxysilane, acryloxypropyl-trimethoxysilane, allyltrimethoxysilane, epoxycyclohexylethyltrimethoxysilane, diphenylsilanediol, 1,2-bis(trimethoxysilyl)methane, 1,2-bis(trimethoxysilyl)ethane, glycidylmethacrylate, dimethyldimethoxysilane, 1-(2-(Trimethoxysilyl)ethyl)cyclohexane-3,4-epoxide, 1,2-bis(triethoxysilyl)ethane, (Heptadecafluoro-1,1,2,2-tetra-hydrodecyl)trimethoxysilane, 1H,1H,2H,2H-perfluorodecyltrimethoxysilane, trimethoxy(3,3,3-trifluoropropyl)silane and mixtures thereof.

In an embodiment, polymeric compositions are provided which contain residues of monomers of formula I and formula II and formula III either one, two or three—and formula VI at a molar ratio of (monomers of formulas I and/or II and/or III calculated together): (monomers of formula VI) of 100:1 to 1:100, in particular 50:1 to 1:50, for example 20:1 to 1:20, such as 10:1 to 1:10.

In one embodiment, the molar ratio of monomers of formula VI to monomers of one, two or three of monomers according to formulas I to IIII, is 50:100-1:100.

According to a preferred embodiment, when using the above monomers, at least one of the monomers used for hydrolysis and condensation is selected from monomers having formulas I or II, wherein at least one substituent is a group capable of providing the hydrophobic and oleophobic characteristics for the coated film. For preparing the prepolymer, the molar portion of units derived from such monomers (or the molar portion of monomers containing the active group calculated from the total amount of monomers) is about 0.1 to 70%, preferably about 0.5 to 50%, in particular about 1 to 40%. In some cases, the group will be present in a concentration of about 1 to 15% based on the molar portion of monomers.

According to a preferred embodiment, when using the above monomers, at least one of the monomers used for hydrolysis and condensation is selected from monomers having formulas I to III and VI, wherein at least one monomer is a monomer (a bi-silane) according to formula VI. For preparing the prepolymer, the molar portion of units derived from such monomers (or the molar portion of monomers containing the active group calculated from the total amount of monomers) is about 0.1 to 100%, preferably about 0.5 to 50%, in particular about 1 to 30%. In some cases, the active group will be present in a concentration of about 50 to 100% based on the molar portion of monomers.

According to one embodiment, at least 50 mole-% of the monomers being selected from the group of tetraethoxysilane, methyltriethoxysilane, methyltrimethoxysilane, ethyltriethoxysilane, n-butyl-triethoxysilane, methyldiethoxyvinylsilane and dimethyldiethoxysilane and mixtures thereof.

In one embodiment, a monomer of any of Formulas I to IV is homopolymerized to yield a polymer.

In another embodiment, two or more monomers of the same formula (i.e. one or several of Formulas I, II, III—including IV) are copolymerized to yield a polymer. In a further embodiment at least one monomer of one formula (e.g. Formula I) is copolymerized with at least one monomer of at least one other formula (e.g. Formula II or Formula III) to yield a polymer.

In the present context, the term "polymer" will be used both for homo- and copolymers.

Based on the above, and as will appear from the below examples, the present technology comprises an embodiment, wherein
- at least one or several monomers of formulas I to III is homopolymerized or are copolymerized, preferably by first hydrolysing the monomers and then condensation polymerizing them, to form a first homo- or copolymer containing residues of monomers having a formula I to III; and
- at least one monomer of formula VI is homopolymerized or are copolymerized, preferably by first hydrolysing the monomers and then condensation polymerizing them, to form a homo- or copolymer containing residues of monomers having formula VI; and
- mixing the such obtained first and second polymers to form a polymer blend.

As also will appear from the below examples, the present technology comprises another embodiment, wherein
- at least one monomer of formula I to III and at least one monomer of formula VI are copolymerized, preferably by first hydrolysing the monomers and then condensation polymerizing them, to form a copolymer containing residues of monomers having a formula I to III and VI.

In one further embodiment which is applicable to the above methods, the hydrolysation and condensation polymerization or copolymerization of at least one monomer, preferably 2 or more monomers, of formulas I to III and VI, and combinations thereof, is carried out such that
- hydrolysation is performed at a pH of less than 2,
- the organic phase containing the monomer is washed with water or an aqueous solution, then
- the washed organic phase is treated with an alkaline agent, such as an amine, at a pH in excess of 11, and finally
- the organic phase thus obtained is washed with water to adjust pH to a value in the range of 7 to 9.

It has been found that polymers of high molecular weight can be obtained by the afore-going embodiment.

In one embodiment, the thus polymers obtained have a molecular weight of about 300 to 120,000 g/mol, typically 3000 to 100,000 g/mol. Thus they are useful as prepolymers which after deposition are capable of being cured to yield a final polymer having a molecular weight of about 30,000 to 10,000,000 g/mol, typically about 40,000 to 5,000,000 g/mol or 70,000 to 1,000,000 g/mol.

In one embodiment, the siloxane composition comprises a siloxane polymer in a solvent phase, wherein
- a partially cross-linked prepolymer has a siloxane backbone formed by repeating —Si—O— units and having a molecular weight in the range of from about 4,000 to about 30,000 g/mol, the siloxane backbone exhibiting hydroxyl groups in an amount of about 5 to 70% of the —Si—O— units and further exhibiting epoxy groups in an amount of 1 to 30 mol %, calculated from the amount of repeating units; and
- the composition further comprises 0.1-3%, based on the weight of the solid matter, at least one cationic photo reactive compound.

The synthesis of the siloxane polymer is carried out in two steps. In the first synthesis step, in the following also called the hydrolysis step, the precursor molecules are hydrolyzed in presence typically of water and a catalyst, such as hydrochloric acid or nitric acid or another mineral or organic acid or a base, and in the second step, the polymerization step, the molecular weight of the material is increased by condensation polymerization or other crosslinking depending on what precursors are chosen to the synthesis. The water used in the hydrolysis step has typically a pH of less than 7, preferably less than 4, in particular less than 2.

It may be preferable in some cases to carry out the condensation polymerization in the presence of a suitable catalyst. In this step the molecular weight of the prepolymer is increased to facilitate suitable properties of the material and film deposition and processing.

The siloxane polymer synthesis, including the hydrolysis, the condensation and the cross-linking reactions, can be carried out using an inert solvent or inert solvent mixture, such as acetone or PGMEA, "non-inert solvent", such as alcohols, or without a solvent. The used solvent affects the final siloxane polymer composition. The reaction can be carried out in basic, neutral or acidic conditions in the presence of a catalyst. The hydrolysis of the precursors may be done in the presence of water (excess of water, stoichiometric amount of water or sub-stoichiometric amount of water). Heat may be applied during the reaction and refluxing can be used during the reaction.

The shelf life stability of the present prepolymers is typically at least 3 months at room temperature, preferably over 6 months at room temperature.

If necessary, at the conclusion of the prepolymerization step, the polymer is typically stabilized, for example to reach the above shelf life stability requirement, by end-capping the polymer chain, for example by blocking terminal groups, such as hydroxyl groups. Suitable reagents are silyl compounds. These silyl compounds include chlorotrimethylsilane, chlorodimethylvinylsilane, ethoxytrimethylsilane, ethoxydimethylvinylsilane and methoxytrimetylsilane.

Typically before the further condensation the excess of water is removed from the material and at this stage it is possible to make a solvent exchange to another synthesis solvent if desired. This other synthesis solvent may function as the final or one of the final processing solvents of the siloxane polymer. The residual water and alcohols and other by-products may be removed after the further condensation step is finalized. Additional processing solvent(s) may be added during the formulation step to form the final processing solvent combination. Additives such as thermal initiators, radiation sensitive initiators, surfactants and other additives may be added prior to final filtration of the siloxane polymer. After the formulation of the composition, the polymer is ready for processing.

Suitable solvents for the synthesis are, for example, acetone, tetrahydrofuran (THF), toluene, 1-propanol, 2-propanol, methanol, ethanol, propylene glycol monomethyl ether, propylene glycol propyl ether, methyl-tert-butylether (MTBE), propylene glycol monomethylether acetate (PGMEA), propylene glycol monomethylether PGME and propylene glycol propyl ether (PnP), PNB, IPA, MIBK, Glycol Ethers (Oxitols, Proxitols), Butyl Acetates, MEK Acetate, or mixtures of these solvents or other suitable solvents.

After synthesis, the material is diluted using a proper solvent or solvent combination to give a solid content and coating solution properties which with the selected film deposition method will yield the pre-selected film thickness. Suitable solvents for the formulation are example 1-propanol, 2-propanol, ethanol, propylene glycol monomethyl ether, propylene glycol propyl ether (PNP), methyl-tert-butylether (MTBE), propylene glycol monomethylether acetate (PGMEA), propylene glycol monomethylether PGME and PNB, IPA, MIBK, Glycol Ethers (Oxitols, Proxitols), Butyl Acetates, MEK Acetate, or mixtures of these solvents or other suitable solvents. The final coating film thickness has to be optimized according for each device and structure fabrication process.

Optionally, an initiator or catalyst compound is added to the siloxane composition after synthesis. The initiator, which can be similar to the one added during polymerization, is used for creating a species that can initiate the polymerization of the "active" functional group in the UV curing step. Thus, in case of an epoxy group, cationic or anionic initiators can be used. In case of a group with double bonds as "active" functional group in the synthesized material, radical initiators can be employed. Also thermal initiators (working according to the radical, cationic or anionic mechanism) can be used to facilitate the cross-linking of the "active" functional groups. The choice of a proper combination of the photoinitiators also depends on the used exposure source (wavelength).

The concentration of the photo or thermally reactive compound in the composition is generally about 0.1 to 10%, preferably about 0.5 to 5%, calculated from the mass of the siloxane polymer.

The patterning of the thermally and/or irradiation sensitive material compositions can be performed via direct lithographic patterning, conventional lithographic masking and etching procedure, imprinting and embossing, but are not limited to these.

The compositions can be used for making layers which are cured at relatively low processing temperatures, e.g. at a temperature of max 350° C. or even at temperature of 100° C. and in the range between these limits.

However the coating layer formed from the material compositions can also be cured at higher temperatures, i.e. temperatures over 375° C. and up to 400° C., or even up to 800° C., making it possible for the material films or structures to be cured at a high temperature curing, such as tempering of the glass and furthermore can be combined with a subsequent high temperature deposition step, such as sputtering, firing, thermal evaporation and/or a CVD process.

After film deposition (optionally patterning) and curing, the material film and/or structures are capable of withstanding aggressive environmental conditions and has high mechanical durability and chemical stability, through which long-term stability of the anti-smudge and easy-to-clean properties and antireflective properties is achieved and sustained.

In the following, the invention will be illustrated with the aid of a number of working examples giving further details of the preparation of the above-discussed siloxane polymer coating compositions.

Solvent variations required for different applications processes, include: PNP (propylene glycol propyl ether), PGMEA, PGME, PNB (propandiol-monobutyl ether), IPA (2-propanol), MTBE (methyl tert butyl ether), MIBK (methyl isobutyl ketone), Glycol Ethers (Oxitols, Proxitols), Butyl Acetates, MEK Acetate, or mixtures of these solvents or other suitable solvents.

The following non-limiting examples illustrate embodiments of the present technology.

MATERIAL SYNTHESIS EXAMPLES

Example 1

Tetraethoxysilane (50 grams), methyltrimethoxysilane (30 grams), isopropanol (370 grams) and nitric acid (80 grams) were mixed together and solution was stirred for 3 hours at room temperature. After stirring the mixture was washed by using distilled water and methyl tert butyl ether (700 grams). Washed solution was solvent exchanged to Isopropanol (800 grams). Triethylamine (2.0 grams) was added to the solution. Solution was refluxed for 2 hours. After refluxing the material was washed by using distilled water and methyl tea butyl ether (650 grams). Washed solution was solvent exchanged to propylene glycol propyl ether (600 grams). Material was diluted to process formulation and filtrated with 0.1 µm filter to obtain process ready solution.

Example 2

Tetraethoxysilane (50 grams), methyltrimethoxysilane (30 grams), isopropanol (370 grams) and nitric acid (80 grams) were mixed together and solution was stirred for 3 hours at room temperature. After stirring the mixture was washed by using distilled water and methyl tert butyl ether (700 grams). Washed solution was solvent exchanged to Isopropanol (800 grams). Triethylamine (2.0 grams) was added to the solution. Solution was refluxed for 2 hours. After refluxing the material was washed by using distilled water and methyl tert butyl ether (650 grams). The washed solution was solvent exchanged to propylene glycol propyl ether (600 grams). Chlorotrimethylsilane (0.15 grams) was added as an end-capping agent, and material was refluxed for 1 h. After the reflux material further distilled to propylene glycol propyl ether. The material was diluted to process formulation and filtrated with 0.1 µm filter to obtain a solution ready for processing.

Example 3

Tetraethoxysilane (40 grams), methyltrimethoxysilane (25 grams), isopropanol (320 grams) and nitric acid (50 grams) were mixed together and solution was stirred for 2 hours at room temperature. After stirring the mixture was washed by using distilled water and methyl tert butyl ether (600 grams). Washed solution was solvent exchanged to Isopropanol (600 grams). Triethylamine (1.5 grams) was added to the solution. Solution was refluxed for 1.5 hours. After refluxing the material was washed by using distilled water and methyl tert butyl ether (550 grams). Washed solution was solvent exchanged to propylene glycol methyl ether acetate (500 grams). Chlorotrimethylsilane (0.15 grams) was added as an end-capping agent, and material was refluxed for 1 h. After the reflux material further distilled to propylene glycol methyl ether acetate. Material was diluted to process formulation and filtrated with 0.1 µm filter to obtain process ready solution.

Example 4

Tetraethoxysilane (40 grams), methyltrimethoxysilane (25 grams), isopropanol (320 grams) and nitric acid (50 grams) were mixed together and solution was stirred for 2 hours at room temperature. After stirring the mixture was washed by using distilled water and methyl tert butyl ether (600 grams). Washed solution was solvent exchanged to Isopropanol (600 grams). Triethylamine (1.5 grams) was added to the solution. Solution was refluxed for 1 hour. After refluxing the material was washed by using distilled water and methyl tert butyl ether (550 grams). Washed solution was solvent exchanged to 1-methoxy-2-propanol (500 grams). Chlorotrimethylsilane (0.15 grams) was added as an end-capping agent, and material was refluxed for 1 h. After the reflux material further distilled to 1-methoxy-2-propanol. Material was diluted to process formulation and filtrated with 0.1 μm filter to obtain process ready solution.

Example 5

Tetraethoxysilane (30 grams), methyltrimethoxysilane (20 grams), isopropanol (200 grams) and nitric acid (40 grams) were mixed together and solution was stirred for 2 hours at room temperature. After stirring the mixture was washed by using distilled water and methyl tert butyl ether (900 grams). Washed solution was solvent exchanged to Isopropanol (500 grams). Triethylamine (0.15 grams) was added to the solution. Solution was refluxed for 1.5 hours. After refluxing the material was washed by using distilled water and methyl tert butyl ether (900 grams). Washed solution was solvent exchanged to isopropanol (250 grams). Chlorotrimethylsilane (0.1 grams) was added as an end-capping agent, and material was refluxed for 1 h. After the reflux material further distilled to isopropanol. Material was diluted to process formulation and filtrated with 0.1 μm filter to obtain process ready solution.

Example 6

Tetraethoxysilane (200 grams), methyltrimethoxysilane (70 grams), isopropanol (500 grams) and nitric acid (100 grams) were mixed together and solution was stirred for 2 hours at room temperature. After stirring the mixture was washed by using distilled water and methyl tert butyl ether (2000 grams). Washed solution was solvent exchanged to Isopropanol (500 grams). Triethylamine (2.1 grams) was added to the solution. Solution was refluxed for 30 minutes. After refluxing the material was washed by using distilled water and methyl tert butyl ether (2000 grams). Washed solution was solvent exchanged to propylene glycol propyl ether (250 grams). Chlorotrimethylsilane (0.05 grams) was added as an end-capping agent, and material was refluxed for 1 h. After the reflux material further distilled to propylene glycol propyl ether. Material was diluted to process formulation and filtrated with 0.1 μm filter to obtain process ready solution.

Example 7

Tetraethoxysilane (200 grams), isopropanol (800 grams) and hydrochloric acid (80 grams) were mixed together and solution was refluxed for 2 hours. After stirring the mixture was washed by using distilled water and methyl tert butyl ether (2500 grams). Washed solution was solvent exchanged to Isopropanol (500 grams). Triethylamine (0.2 grams) was added to the solution. Solution was stirred at room temperature for 2 hours. After stirring the solution was washed by using distilled water and methyl tert butyl ether (2000 grams). Washed solution was solvent exchanged to propylene glycol propyl ether (500 grams). Chlorotrimethylsilane (0.1 grams) was added as an end-capping agent, and material was refluxed for 1 h. After the reflux material further distilled to propylene glycol propyl ether. Material was diluted to process formulation and filtrated with 0.1 μm filter to obtain process ready solution.

Example 8

Synthesis 1
Isopropanol (3771 g), nitric acid (804 g), tetraethoxysilane (570 g) and methyltrimethoxysilane (373 g) were mixed together and solution was stirred at room temperature for 3 hours. After stirring the mixture was washed by using distilled water and methyl tert butyl ether (7000 grams). Washed solution was solvent exchanged to Isopropanol (4000 grams). Triethylamine (25.4 grams) was added to the solution. Solution was refluxed for 40 minutes. After refluxing the material was washed by using distilled water and methyl tert butyl ether (7500 grams). Washed solution was solvent exchanged to propylene glycol monomethyl ether acetate (8000 grams). Chlorotrimethylsilane (3.25 grams) was added as an end-capping agent, and material was refluxed for 1 h. After the reflux material further distilled to propylene glycol propyl ether. Material was diluted to process formulation and filtrated with 0.1 μm filter to obtain a process ready solution. The resulting molecular weight of the polymer was about 75 000-80 000 g/mol Synthesis 2
Acetone (2560 g), 1,2-Bis(triethoxysilyl)ethane (600 g) and nitric acid (200 g) were mixed and solution was refluxed for 45 minutes. After refluxing a solvent exchange was performed to propylene glycol methyl ether (2400 grams). Material solid content was adjusted to process formulation and filtrated with 0.1 μm filter to obtain a process ready solution. Molecular weight of the polymer is about 2000-2500 g/mol.

Synthesis 3
Acetone (1200 g), 2-propanol (400 g), 1,2-Bis(triethoxysilyl)ethane (390, 5 g), 3-glycidoxypropyltrimethoxysilane (2.05 g), (Heptadecafluoro-1,1,2,2-tetrahydrodecyl)trimethoxysilane (6.02 g) and nitric acid (125 grams) were mixed and solution was refluxed for 60 minutes at 65 C. After refluxing a solvent exchange was performed to propylene glycol methyl ether (1200 grams). Ethoxytrimethylsilane (1.60 g) was added from solid content and refluxed at 105 C for 30 min. After refluxing a solvent exchange was performed to propylene glycol methyl ether (50 grams). Material solid content was adjusted to process formulation and filtrated with 0.1 μm filter to obtain a process ready solution. Molecular weight of the polymer is about 5000-7000 g/mol.

Synthesis 4
Acetone (1900 g), 2-propanol (630 g), 1,2-Bis(triethoxysilyl)ethane (580 g), 3-glycidoxypropyltrimethoxysilane (4.5 g) and (Heptadecafluoro-1,1,2,2-tetrahydrodecyl)trimethoxysilane (28 g) and nitric acid (340 grams) were mixed and solution was refluxed for 120 minutes at 65 C. After refluxing a solvent exchange was performed to propylene glycol methyl ether (1800 grams). Material solid content was adjusted to process formulation and filtrated with 0.1 μm filter to obtain a process ready solution. Molecular weight of the polymer is about 2500-7000 g/mol.

Example 8A

Polymer material solution from Synthesis 1 formulated with propylene glycol methyl ether to solid content 2.6%. After formulation material is ready to be used.

Example 8B

Polymer material solution from Synthesis 1 and polymer material solution from Synthesis 2 are combined so that ratio of the solid polymers is 85:15 respectively. Mixture of the polymer solutions is formulated with propylene glycol methyl ether to solid content 2.7%. After formulation material is ready to be used.

Example 8C

Polymer material solution from Synthesis 1 and polymer material solution from Synthesis 2 are combined so that ratio of the solid polymers is 70:30 respectively. Mixture of the polymer solutions is formulated with propylene glycol methyl ether to solid content 2.7%. After formulation material is ready to be used.

Example 8D

Polymer material solution from Synthesis 1 and polymer material solution from Synthesis 3 are combined so that ratio of the solid polymers is 85:15 respectively. Mixture of the polymer solutions is formulated with propylene glycol methyl ether to solid content 2.7%. After formulation material is ready to be used.

Example 8E

Polymer material solution from Synthesis 1 and polymer material solution from Synthesis 4 are combined so that ratio of the solid polymers is 85:15 respectively. Mixture of the polymer solutions is formulated with propylene glycol methyl ether to solid content 2.7%. After formulation material is ready to be used.

Example 9

Tetraethoxysilane (45 grams), methyltrimethoxysilane (30 grams) and trifluoropropyl-trimethoxysilane (5 grams), isopropanol (200 grams) and nitric acid (35 grams) were mixed together and solution was stirred for 2 hours at room temperature. After stirring the mixture was washed by using distilled water and methyl tert butyl ether (900 grams). Washed solution was solvent exchanged to Isopropanol (500 grams). Triethylamine (0.15 grams) was added to the solution. Solution was refluxed for 2 hours. After refluxing the material was washed by using distilled water and methyl tert butyl ether (900 grams). Washed solution was solvent exchanged to propylene glycol propyl ether (250 grams). Ethoxytrimethylsilane (0.1 grams) was added as an end-capping agent, and material was refluxed for 1 h. After the reflux material further distilled to propylene glycol propyl ether. Material was diluted to process formulation and filtrated with 0.1 µm filter to obtain process ready solution.

Example 10

Tetraethoxysilane (15 grams), Methyltrimethoxysilane (9 grams), isopropanol (100 grams and Nitric acid (20 grams) were mixed together and solution was refluxed for 1 hours. After reflux the solution was solvent exchanged to propylene glycol propyl ether (300 grams). Material was diluted to process formulation and filtrated with 0.1 µm filter to obtain process ready solution.

Example 11

Tetraethoxysilane (45 grams), methyltrimethoxysilane (30 grams) and Heptadecafluoro-1,1,2,2-tetrahydrodecyl) trimethoxysilane (6.5 grams), isopropanol (200 grams) and nitric acid (38 grams) were mixed together and solution was stirred for 2 hours at room temperature. After stirring the mixture was washed by using distilled water and methyl tert butyl ether (900 grams). Washed solution was solvent exchanged to Isopropanol (500 grams). Triethylamine (0.15 grams) was added to the solution. Solution was refluxed for 2 hours. After refluxing the material was washed by using distilled water and methyl tert butyl ether (900 grams). Washed solution was solvent exchanged to propylene glycol propyl ether (250 grams). Chlorotrimethylsilane (0.1 grams) was added as an end-capping agent, and material was refluxed for 1 h. After the reflux material further distilled to propylene glycol propyl ether. Material was diluted to process formulation and filtrated with 0.1 µm filter to obtain process ready solution.

Example 12

Tetraethoxysilane (45 grams), methyltrimethoxysilane (30 grams) and 3-(Trimethoxysilyl)propylmethacrylate (20 grams), isopropanol (200 grams) and nitric acid (30 grams) were mixed together and solution was stirred for 2 hours at room temperature. After stirring the mixture was washed by using distilled water and methyl tert butyl ether (900 grams). Washed solution was solvent exchanged to Isopropanol (500 grams). Triethylamine (0.15 grams) was added to the solution. Solution was refluxed for 2 hours. After refluxing the material was washed by using distilled water and methyl tert butyl ether (900 grams). Washed solution was solvent exchanged to propylene glycol propyl ether (250 grams). Chlorotrimethylsilane (0.1 grams) was added as an end-capping agent, and material was refluxed for 1 h. After the reflux material further distilled to propylene glycol propyl ether. Material was diluted to process formulation and filtrated with 0.1 µm filter to obtain process ready solution.

Example 13

Tetraethoxysilane (45 grams), methyltrimethoxysilane (30 grams) and 3-Glycidoxypropyltrimethoxysilane (22 grams), isopropanol (200 grams) and nitric acid (30 grams) were mixed together and solution was stirred for 2 hours at room temperature. After stirring the mixture was washed by using distilled water and methyl tert butyl ether (900 grams). Washed solution was solvent exchanged to Isopropanol (500 grams). Triethylamine (0.15 grams) was added to the solution. Solution was refluxed for 2 hours. After refluxing the material was washed by using distilled water and methyl tert butyl ether (900 grams). Washed solution was solvent exchanged to propylene glycol propyl ether (250 grams). Chlorotrimethylsilane (0.1 grams) was added as an end-capping agent, and material was refluxed for 1 h. After the reflux material further distilled to propylene glycol propyl ether. Material was diluted to process formulation and filtrated with 0.1 µm filter to obtain process ready solution.

Example 14

Tetraethoxysilane (45 grams), methyltrimethoxysilane (30 grams) and 1,2-Bis(triethoxysilyl)ethane (12 grams), isopropanol (200 grams) and nitric acid (30 grams) were mixed together and solution was stirred for 2 hours at room temperature. After stirring the mixture was washed by using distilled water and methyl tea butyl ether (900 grams). Washed solution was solvent exchanged to isopropanol (500 grams). Triethylamine (0.15 grams) was added to the solution. Solution was refluxed for 2 hours. After refluxing the material was washed by using distilled water and methyl tert butyl ether (900 grams). Washed solution was solvent exchanged to propylene glycol propyl ether (250 grams). Ethoxytrimethylsilane (0.1 grams) was added as an end-capping agent, and material was refluxed for 1 h. After the reflux material further distilled to propylene glycol propyl ether. Material was diluted to process formulation and filtrated with 0.1 μm filter to obtain process ready solution.

Example 15

Tetraethoxysilane (40 grams), methyltrimethoxysilane (25 grams), isopropanol (320 grams) and 3M nitric acid (50 grams) were mixed together and solution was stirred for 2 hours at room temperature. After stirring the mixture was washed by using distilled water and methyl tert butyl ether (600 grams). Washed solution was solvent exchanged to isopropanol (600 grams). Triethylamine (1.5 grams) was added to the solution. Solution was refluxed for 1 hour. After refluxing the material was washed by using distilled water and methyl tert butyl ether (550 grams). Washed solution was solvent exchanged to 2-methoxyethanol (500 grams). Chlorotrimethylsilane (0.15 grams) was added as an end-capping agent, and material was refluxed for 1 h. After the reflux material further distilled to 2-methoxyethanol. Material was diluted to process formulation and filtrated with 0.1 μm filter to obtain process ready solution.

In the above examples 1, 2, 3, 4, 5, 6, 7, 8 (synthesis 1, 8A), 9, 11, 12, 13, 14, 15 the pH in the hydrolysis step was 1-2. After the first "distilled water/methyl tert butyl ether" washing step the pH of the solution was 5-7. The further condensation polymerization was carried in presence of a base (triethylamine) at pH 10-12. After the second "distilled water/methyl tert butyl ether" washing step the pH of the washed solution was essentially neutralized to 6-8.

In the above homopolymer examples 2, 3, 4, 5, 6, 7, 8 (synthesis 1, 8A), 9, 11, 12, 13, 14, 15 termination/end-capping by chlorotrimethylsilane or ethoxytrimetylsilane was applied.

In comparison, the material in example 1 was not terminated/end-capped during the synthesis.

By end-capping further improvement in prepolymer formulation stability can be reached.

TABLE 2

| Material | Thermal Curing | Film refractive index [at 632 nm] | Film thickness [nm] |
|---|---|---|---|
| Example 16 | 240 C. | 1.91 | 96 nm |
| Example 17 | 240 C. | 1.83 | 97 nm |
| Example 18 | 240 C. | 1.71 | 93 nm |
| Example 19 | 240 C. | 1.56 | 103 nm |
| Example 20 | 240 C. | 1.76 | 105 nm |
| Example 21 | 240 C. | 1.94 | 79 nm |
| Example 22 | 240 C. | 1.66 | 81 nm |

Example 16

Titanium isopropoxide (20.00 g) and 1-Ethoxy-2-propanol (100 ml) were weighted into the 500 ml flask and stirred for 30 minutes. Ethyl Acetoacetate (18 g) was added and stirred for 30 minutes. DI-water (5 g) was added to the prepared solution and mixed and stirred overnight. Solvent exchange was done to propylene glycol ethyl ether (PGEE). Material was diluted to process formulation and filtrated with 0.1 μm filter to obtain process ready solution.

Example 17

Titanium isopropoxide (20.00 g) and Isopropanol 200 ml were weighted in 500 ml flask and stirred for 30 minutes. Ethyl Acetoacetate was added and stirred for 30 minutes. Methyltrimethoxysilane (1.0 g) and Isopropanol (20 ml) were weighted in 250 ml flask and stirred for 20 min. The prepared two solutions were mixed and stirred overnight with presence of HNO3 (2.5 g). Solvent exchange was done to propylene glycol ethyl ether. Material was diluted to process formulation and filtrated with 0.1 μm filter to obtain process ready solution.

Example 18

Titanium isopropoxide (20.00 g) and Isopropanol 200 ml were weighted in 500 ml flask and stirred for 30 minutes. Ethyl Acetoacetate was added and stirred for 30 minutes. Methyltrimethoxysilane (3.0 g) and Isopropanol (20 ml) were weighted in 250 ml flask and stirred for 20 min. The prepared two solutions were mixed and stirred overnight with presence of HNO3 (2.5 g). Solvent exchange was done

TABLE 1

| Material | Curing | Mw | Film refractive index [at 632 nm] | Film thickness [nm] | Pencil hardness | Transmission (Average 400-800 nm); Day 0 | Transmission (Average 400-800 nm); after 1000 h 85/85 test | Water contact angle; Day 0 | Water contact angle; after 85/85 1000 h |
|---|---|---|---|---|---|---|---|---|---|
| Blank glass | | | | | | 91.0 | 90.8 | 35 | 38 |
| Example 1. | 300 C. | 75000 | 1.27 | 115 nm | 4-5H | 94.6% | 94.4% | 98 | 97 |
| Example 2. | 300 C. | 84600 | 1.25 | 115 nm | 4-5H | 94.7% | 94.6% | 103 | 102 |
| Example 3. | 300 C. | 77000 | 1.255 | 120 nm | 4-5H | 94.5% | 94.4% | 100 | 96 |
| Example 4. | 650 C. | 78000 | 1.28 | 120 nm | 4-5H | 94.6% | 94.5% | 103 | 100 |
| Example 7. | 300 C. | 33500 | 1.36 | 80 nm | 3-4H | 92.8% | 92.6% | 12 | 30 |
| Example 8A. | 300 C. | 81128 | 1.28 | 115 nm | 4-5H | 94.6 | 94.5% | 91 | 90 |
| Example 8B. | 300 C. | 36300 | 1.33 | 110 nm | 5-6H | 94.4 | 94.2 | 92 | 91 |
| Example 8C. | 300 C. | 33800 | 1.35 | 115 nm | 6H | 94.0 | 93.8 | 93 | 91 |
| Example 8D. | 300 C. | 42300 | 1.32 | 110 nm | 5-6H | 94.5 | 94.3 | 101 | 99 |
| Example 9. | 300 C. | 98000 | 1.28 | 100 nm | 4-5H | 94.5 | 94.2 | 105 | 102 |
| Example 10. | 300 C. | 3400 | 1.38 | 90 nm | 3-4H | 93.2 | 92.4 | 80 | 75 | to propylene glycol ethyl ether. Material was diluted to process formulation and filtrated with 0.1 μm filter to obtain process ready solution.

Example 19

Titanium isopropoxide (20.00 g) and Isopropanol 350 ml were weighted into the 500 ml flask and stirred for 1 hour. Ethyl Acetoacetate was added and stirred for 1 hour. Methyltrimethoxysilane (10 g) and Isopropanol 100 ml were weighted in 250 ml flask and stirred for 45 min. The prepared two solutions were mixed and stirred overnight with presence of HNO3 (9.0 g). Solvent exchange was done to propylene glycol ethyl ether (PGEE). Material was diluted to process formulation and filtrated with 0.1 μm filter to obtain process ready solution.

Example 20

Titanium isopropoxide (40.00 g), Ethyl Acetoacetate (36 g) and Isopropanol (200 g) were weighted into the 500 ml flask and stirred for 1 hour. Phenyltrimethoxysilane (2 g) and methyltrimethoxysilane (5 g) and Isopropanol (50 g) were weighted in 250 ml flask and stirred for 45 min. The prepared two solutions were mixed and stirred overnight with presence of $HNO_3$ (9 g). Solvent exchange was done to propylene glycol ethyl ether (PGEE). Material was diluted to process formulation and filtrated with 0.1 μm filter to obtain process ready solution.

Example 21

Titanium isopropoxide (350 g) was added to a reactor flask. Titanium tetrachloride (235 g) was added to reactor and solution was mixed. Methanol (2500 g) was added to the reactor and solution was stirred for 2 hours. Solvent exchange was done to 2-isopropoxyethanol was added to the material flask. The solution was cooled down to −6° C. Tetraethylamine (1000 g) was added to the material solution. The solution was stirred in the reactor overnight. The solution was filtrated using a filter paper. The solution was formulated to the final processing solvent IPA and diluted to process formulation and filtrated with 0.1 μm filter to obtain process ready solution.

Example 22

Solution 1 was prepared the following way: titanium isopropoxide (20.00 g), Ethyl Acetoacetate (36 g) and Isopropanol (200 g) were weighted into the 500 ml flask and stirred for 1 hour. Methyltrimethoxysilane (10 g) and Isopropanol (40 g) were weighted in 250 ml flask. Water and $HNO_3$ (8 g) was added and solution was stirred for 2 hours. The prepared two solutions were mixed and stirred overnight. Solvent exchange was done to propylene glycol ethyl ether (PGEE).

Solution 2 was prepared the following way: titanium isopropoxide (20.00 g), Ethyl Acetoacetate (36 g) and Isopropanol (200 g) were weighted into the 500 ml flask and stirred for 1 hour. Methyltrimethoxysilane (4 g) and Isopropanol (20 g) were weighted in 250 ml flask. Water and $HNO_3$ (8 g) was added and solution was stirred for 2 hours. The prepared two solutions were mixed and stirred overnight. Solvent exchange was done to propylene glycol ethyl ether (PGEE).

Solution 1 and Solution 2 were mixed in ratio of 30:70 where there was 30 parts of solution 1 and 70 parts of solution 2. The formed solution was mixed for 2 hours. Material was diluted to process formulation and filtrated with 0.1 μm filter to obtain process ready solution.

Example 23

Tetraethoxysilane (7 grams) in 1-propanol (14 grams) and $HNO_3$ (0.6 equivalent) were stirred at room temperature for 20 min. Aluminium-sec-butoxide (21 grams) was added to the mixture. Titanium Isopropoxide (25 grams) was added to the mixture. The mixture was refluxed for 45 minutes. Solvent exchange was performed to 1-propanol. The solution was filtrated with 0.04 μm filter to obtain process ready solution.

Example 24

To a round bottom flask containing 182.7 of ANN-DI water, 42.27 g of Aluminum isopropoxide (AlP) powder was added during 40 min under strong stirring. After AlP addition, 19.18 g of TEOS was added drop-wise during 30 min. The clear solution was stirred over a night at room temperature. Solution was heated up to 60° C. using an oil bath and condenser and stirred at 60° C. for 4 hours. After 4 hours clear solution was further stirred at room temperature for over a night. Solvent exchange was carried out from DI water to 1-propanol using a rotary evaporator with three 1-propanol addition steps (Water bath temperature 60° C.). The total amount of added 1-propanol was 136 g. Total amount of removed solution was 195 g. After solvent exchange solid content of the solution was 16.85 w-%.

Example 25

Aluminium nitrate-nonahydrate (180 g) in water solution was mixed with Titanium (IV) isopropoxide (38 g). After that triethoxysilane (15 g) was added. Solution was refluxed for 4 hours. Solvent exchanged was performed to 1-propanol. The solution was filtrated with 0.04 μm filter to obtain process ready solution.

Example 26

Aluminium nitrate-nonahydrate (180 g) in water solution was mixed with Aluminium isopropoxide (20 g) and Tantalum ethoxide (22 g). After that tetraethoxysilane (15 g) was added. Solution was refluxed for 4 hours. Solvent exchanged was performed to 1-propanol. The solution was filtrated with 0.1 μm filter to obtain process ready solution.

Example 27

Aluminium nitrate-nonahydrate (180 g) in water solution was mixed with Aluminium isopropoxide (35 g). After that tetraethyl orthosilicate (5 g) and triethoxysilane (14 g) was added. Solution was refluxed for 4 hours. Solvent exchanged was performed to 1-propanol. The solution was filtrated with 0.04 μm filter to obtain 5 process ready solution.

Example 28

20 g of $AlCl_3$ was dissolved to EtOH (200 g) and $TiCl_4$ (10 g) $Ti(iOPr)_4$ (14 g) was dissolved 15 to 200 g of EtOH. Dissolved solutions were combined. Solution was stirred for 60 min at RT. Triethoxysilane (15 g) was added and solution was stirred at RT for 60 min. EtOH was distilled using membrane pump. 220 g of 2-isopropoxyethanol was added to the material flask. Solution was cooled down and filtrated. Solution was formulated to the final processing solvent 1-butanol and was filtrated with 0.1 μm filter to obtain process ready solution.

Example 29

20 g of Aluminium s-butoxide and 200 g of PGEE were weighted to a round bottom flask and stirred at room temperature for 30 min. 15.58 g of Ethyl Acetoacetate was added drop-wise to the solution and stirring at room temperature was continued further 1 h. A mixture of H₇O/PGEE (8 g/40 g) was added to the clear solution dropwise by Pasteur pipette and solution was stirred at room temperature overnight. The solid content of the material is 4.49 w-%.

INDUSTRIAL APPLICABILITY

The present invention can be used for achieving polymer compositions, in particular polymer coating layer materials in display devices, touch screen devices, photovoltaic devices (cells, panels and modules), luminaires, construction glass units and apparatuses.

REFERENCE SIGNS LIST

100, 200, 300, 400, 500, 600, 700, 800, 1100, 1200 Substrate
110, 210, 310, 410, 510, 610, 710, 810, 1110 Coating layer (front side)
220, 420 Coating layer (back side)
205, 405 Surface treatment chemical layer (front side), or optionally other functional coating layer
215, 415 Surface treatment chemical layer (back side), or optionally other functional coating layer

The invention claimed is:

1. A composition of a hybrid organic-inorganic material having an inorganic portion comprising silicon, oxygen and carbon, and further comprising an organic portion with organic groups connected to the inorganic portion, said material comprising a co-polymer comprising monomers of formula VI along with monomers of formulas (I), (II), or (III), or combinations of (I), (II), and (III), the co-polymer obtained from polymerization of:

the monomers according to formula I, $$R^1_a SiX_{4-a} \quad \text{I}$$

formula II, $$R^2_b SiX_{4-b} \quad \text{II}$$

wherein $R^1$ and $R^2$ are independently selected from the group consisting of hydrogen, linear and branched alkyl and cycloalkyl, alkenyl, alkynyl, (alk)acrylate, epoxy, allyl, vinyl, alkoxy and aryl having 1 to 6 rings;
each X represents independently a hydrolysable group or a hydrocarbon residue; and
a and b is an integer 1 to 3;
formula III, $$R^3_c SiX_{4-c} \quad \text{III}$$

wherein $R^3$ stands for hydrogen, alkyl or cycloalkyl which optionally carries one or several substituents, or alkoxy;
each X represents independently a hydrolysable group or a hydrocarbon residue; and
c is an integer 1 to 3;
or combinations thereof,
together with the monomers of formula VI:

$$(R^6)_3Si-Y-Si(R^7)_3, \quad \text{VI}$$

wherein $R^6$ and $R^7$ are independently selected from hydrogen and a member selected from the group consisting of linear or branched alkyl, cycloalkyl, alkenyl, alkynyl, (alk)acrylate, epoxy, allyl, vinyl, alkoxy, and aryl having 1 to 6 rings, and wherein the group is substituted or unsubstituted; and Y is a linking group selected from unsubstituted and substituted bivalent aliphatic and aromatic groups, the unsubstituted and substituted bivalent aliphatic and aromatic groups comprising a member selected from the group consisting of alkylene, arylene, —O-alkylene-O—; —O-arylene-O—; alkylene-O-alkylene, arylene-O-arylene; alkylene-$Z^1$C(=O)$Z^2$-alkylene, arylene-$Z^1$C(=O)$Z^2$-arylene and —O-alkylene-$Z^1$(=O)$Z^2$-alkylene-O—;
—O-arylene-$Z^1$(=O)$Z^2$-arylene-O—, wherein $Z^1$ and $Z^2$ are each selected from a direct bond or —O—;

wherein a molar ratio of (monomers of formulas I and/or II and/or III calculated together):(monomers of formula VI) is from 100:1 to 20:1.

2. The composition of claim 1, wherein monomers of formula VI are selected from the group of 1,2-bis(trimethoxysilyl)methane; 1,2-bis(triethoxysilyl)methane; 1,2-bis(trimethoxysilyl)ethane; 1,2-bis(triethoxysilyl)ethane, 1-(dimethoxymethylsilyl)-1-(trimethoxysilyl)methane; 1-(diethoxymethylsilyl)-1-(triethoxysilyl)methane; 1-(trimethoxymethylsilyl)-2-(dimethoxysilyl)ethane; 1-(dimethoxymethylsilyl)-2-(trimethoxysilyl)ethane; 1-(diethoxymethylsilyl)-2-(triethoxysilyl)ethane; bis(dimethoxymethylsilyl)methane, bis(diethoxymethylsilyl)methane; 1,2-bis(dimethoxymethylsilyl)ethane, 1,2-bis(diethoxymethylsilyl)ethane; 1,2-bis(dichloromethylsilyl)ethane; 1,2-bis(trichlorosilyl)ethane, 1,2-bis(trimethoxysilyl)benzene; 1,2-bis(triethoxysilyl)benzene; 1,3-bis(trimethoxysilyl)benzene, 1,3-bis(triethoxysilyl)benzene; 1,4-bis(trimethoxysilyl)benzene; 1,4-bis(triethoxysilyl)benzene; 4,4'-Bis(triethoxysilyl)-1,1'-biphenyl; 1,4-Bi s(triethoxysilyl)benzene; 1,3-Bis(triethoxysilyl)benzene; and combinations thereof.

3. The composition of claim 1, wherein monomers of formulas I to III are selected from the group of triethoxysilane, tetraethoxysilane, tetramethoxysilane, methyltrimethoxysilane, methyltriethoxysilane, ethyltriethoxysilane, n-butyltriethoxysilane, methyldiethoxyvinylsilane, dimethyldiethoxysilane, phenyltrimethoxysilane, phenantrene-9-triethoxysilane, vinyltrimethoxysilane, 3-glysidoxypropyltrimethoxysilane, aminopropyltrimethoxysilane, methacryloxypropyltrimethoxysilane, methacryloxypropyltriethoxysilane, acryloxypropyl-trimethoxysilane, allyltrimethoxysilane, epoxycyclohexylethyltrimethoxysilane, diphenylsilanediol, 1,2-bis(trimethoxysilyl)methane, 1,2-bis(trimethoxysilyl)ethane, glycidylmethacrylate, dimethyldimethoxysilane, 1-(2-(Trimethoxysilyl)ethyl)cyclohexane-3,4-epoxide, 1,2-bis(triethoxysilyl)ethane, 1H, 1H, 2H, 2H-perfluorodecyltrimethoxysilane, trimethoxy (3,3,3-trifluoropropyl)silane and mixtures thereof.

4. The composition of claim 1, wherein the polymer comprises residues of monomers of formula I, $$R^1_a SiX_{4-a} \quad \text{I}$$

and, wherein $R^1$=alkoxy; X=a hydrolysable group; and a=3.

5. The composition of claim 1, wherein the polymer comprises
residues of monomers of formula II, $$R_2bSiX_{4-b} \qquad \text{II}$$

and, wherein $R_2$=alkyl; X=a hydrolysable group; and b=1.

6. The composition of claim 1, wherein the polymer comprises
residues of monomers of formula III, $$R^3{}_cSiX_{4-c} \qquad \text{III}$$

and, wherein $R^3$=alkyl; X=a hydrolysable group; and c=3.

7. The composition of claim 1, wherein the monomers of formula (VI)

$$(R^6)_3Si{-}Y{-}Si(R^7)_3 \qquad \text{VI}$$

comprise $R^6$=alkoxy; $R^7$=alkoxy; and Y=alkylene.

8. The composition of claim 1, wherein the polymer is obtained from the polymerization of monomers according to each of formulas (I), (II), (III), and (VI).

9. The composition of claim 1, wherein the composition comprises a water contact angle of at least 90° or a water contact angle of 40° or less.

10. The composition of claim 1, wherein the composition comprises a surface roughness of 0.5 nm to 5.0 nm and a pencil hardness of at least 4H.

11. The composition of claim 1, wherein the composition comprises a refractive index of from 1.25 to 1.45 nm at 632 nm.

12. A device comprising an anti-reflective coating comprising the composition of claim 1.

* * * * *